United States Patent
Lee

(10) Patent No.: US 11,782,553 B2
(45) Date of Patent: Oct. 10, 2023

(54) DISPLAY DEVICE HAVING DIFFERENT MODES FOR TRANSMITTING A SENSING SIGNAL IN AN AREA AND A DRIVING METHOD THEREOF

(71) Applicant: SAMSUNG DISPLAY CO., LTD., Yongin-si (KR)

(72) Inventor: Soon Gyu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/684,605

(22) Filed: Mar. 2, 2022

(65) Prior Publication Data
US 2022/0404946 A1 Dec. 22, 2022

(30) Foreign Application Priority Data
Jun. 17, 2021 (KR) .................. 10-2021-0079005

(51) Int. Cl.
*G06F 3/041* (2006.01)
*G06F 3/044* (2006.01)
*H10K 59/40* (2023.01)

(52) U.S. Cl.
CPC ........ *G06F 3/04166* (2019.05); *G06F 3/0446* (2019.05); *G06F 3/04184* (2019.05); *G06F 3/041661* (2019.05); *G06F 3/041662* (2019.05); *G06F 3/0412* (2013.01); *G06F 2203/04101* (2013.01); *G06F 2203/04103* (2013.01); *H10K 59/40* (2023.02)

(58) Field of Classification Search
CPC .............. G06F 3/04184; G06F 3/0446; G06F 3/041661; G06F 3/041662; G06F 3/04166; G06F 3/0416; G06F 3/0412; G06F 2203/04101; H01L 27/323
See application file for complete search history.

(56) References Cited

U.S. PATENT DOCUMENTS

| 9,274,589 | B2 | 3/2016 | Park |
| 9,569,046 | B2 | 2/2017 | Kim et al. |
| 9,778,790 | B2* | 10/2017 | Shepelev .............. G06F 3/0443 |
| 2011/0157068 | A1* | 6/2011 | Parker ................... G06F 3/0446 |
|  |  |  | 345/174 |

(Continued)

FOREIGN PATENT DOCUMENTS

| KR | 10-1362843 | 2/2014 |
| KR | 10-1572331 | 11/2015 |
| KR | 10-2140791 | 8/2020 |

*Primary Examiner* — Darlene M Ritchie
(74) *Attorney, Agent, or Firm* — F. Chau & Associates, LLC

(57) ABSTRACT

A display device including: a pixel part including pixels; a sensor part overlapping the pixel part and including sensors; and a sensor driver that transmits a sensing signal to p sensors in a first area of the sensor part in a first mode, transmits the sensing signal to q sensors in the first area in a second mode, and transmits the sensing signal to r sensors in the first area in a third mode, wherein p is an integer greater than 0, q and r are integers greater than p, and the sensor driver sets a sensing frequency, the first area, the number of sensing times per sensing frame period, whether or not the sensor driver is synchronized with a timing signal of the pixel part, or a voltage level of the sensing signal, to be different in the second mode and the third mode.

20 Claims, 31 Drawing Sheets

(56) References Cited

U.S. PATENT DOCUMENTS

| | | | |
|---|---|---|---|
| 2012/0154324 A1* | 6/2012 | Wright | G06F 3/041661 |
| | | | 345/174 |
| 2016/0092000 A1* | 3/2016 | Morein | G06F 3/0412 |
| | | | 345/174 |
| 2017/0090619 A1* | 3/2017 | Yousefpor | G06F 3/0418 |
| 2018/0032202 A1* | 2/2018 | Kim | G06V 40/1365 |
| 2018/0275794 A1* | 9/2018 | Takada | G06F 3/04164 |
| 2020/0005012 A1* | 1/2020 | Hong | G06F 3/0446 |
| 2020/0150805 A1* | 5/2020 | Kim | G06F 3/044 |
| 2021/0089188 A1* | 3/2021 | Lin | G09G 3/20 |
| 2021/0191567 A1* | 6/2021 | Gu | G06F 3/041662 |
| 2021/0333975 A1* | 10/2021 | Miyamoto | G06F 3/03545 |
| 2022/0229533 A1* | 7/2022 | Ito | G06F 3/0412 |

* cited by examiner

DISPLAY DEVICE HAVING DIFFERENT MODES FOR TRANSMITTING A SENSING SIGNAL IN AN AREA AND A DRIVING METHOD THEREOF

CROSS-REFERENCE TO RELATED APPLICATION

This application claims priority under 35 U.S.C. § 119 to Korean Patent Application No. 10-2021-0079005 filed in the Korean Intellectual Property Office on Jun. 17, 2021, the disclosure of which is incorporated by reference herein in its entirety.

TECHNICAL FIELD

The present invention relates to a display device and a driving method thereof.

DESCRIPTION OF THE RELATED ART

A display device is an output device for presentation of information in visual form. For example, a display device is a connection medium between a user and information. Accordingly, display devices such as a liquid crystal display device, an organic light emitting display device, and the like are increasingly used in various electronic devices such as smartphones, digital cameras, notebook computers, navigation systems, and smart televisions.

Display devices may employ touch screen technologies that are responsive to a user's touch. Such a display device may include a display part for displaying an image and a sensor part for sensing a touch position. In this case, the sensor part may be used to measure coordinates of a touch position of an object, or may be used to check whether an object approaches.

SUMMARY

The present invention provides a display device and a driving method thereof that may further effectively determine whether an object is in proximity and, in particular, may further effectively determine release of an object.

An embodiment of the present invention provides, a display device including: a pixel part including pixels; a sensor part overlapping the pixel part and including sensors; and a sensor driver that transmits a sensing signal to p sensors in each sensing time in a first area of the sensor part in a first mode comprising a plurality of sensing times, transmits the sensing signal to q sensors in each sensing time in the first area in a second mode comprising a plurality of sensing times, and transmits the sensing signal to r sensors in each sensing time in the first area in a third mode comprising a plurality of sensing times, wherein p is an integer greater than 0, q and r are integers greater than p, and the sensor driver sets a sensing frequency, the first area, the number of sensing times per sensing frame period, whether or not the sensor driver is synchronized with a timing signal of the pixel part, or a voltage level of the sensing signal, to be different in the second mode and the third mode.

The sensor driver may set the sensing frequency of the third mode to be lower than the sensing frequency of the second mode.

The sensor driver may set the sensing frequency of the first mode to be higher than the sensing frequency of the second mode.

The sensor driver may set the first area of the third mode to be smaller than the first area of the second mode.

The sensor driver may supply the sensing signal only to the sensors of the first area in the third mode, and the sensor driver may supply the sensing signal to the sensors outside of the first area in the second mode.

The sensor driver may set the first area of the third mode to partially overlap the first area of the second mode or to not overlap the first area.

The sensor driver may set the number of sensing times per sensing frame period of the third mode to be larger than the number of sensing times per sensing frame period of the second mode.

The sensor driver may set the number of sensing times per sensing frame period of the first mode to be smaller than the number of sensing times per sensing frame period of the second mode.

The timing signal may include a horizontal synchronization signal, and the sensor driver may be asynchronous with the horizontal synchronization signal in the third mode when supplying the sensing signal.

The sensor driver may be synchronized with the horizontal synchronization signal in the second mode when supplying the sensing signal.

The sensor driver may set the voltage of the sensing signal of the third mode to be smaller than the voltage of the sensing signal of the second mode.

The sensor driver may set the voltage of the sensing signal of the first mode to be the same as the voltage of the sensing signal of the second mode.

The pixel part may be in a display state in the first mode and the second mode, and in a non-display state in the third mode.

An embodiment of the present invention provides, a driving method of a display device including: transmitting, by a sensor driver, a sensing signal to p sensors in each sensing time in a first area of a sensor part in a first mode comprising a plurality of sensing times; transmitting, by the sensor driver, the sensing signal to q sensors in each sensing time in the first area in a second mode comprising a plurality of sensing times; and transmitting, by the sensor driver, the sensing signal to r sensors in each sensing time in the first area in a third mode comprising a plurality of sensing times, wherein p is an integer greater than 0, q and r are integers greater than p, and a sensing frequency, the first area, the number of sensing times per sensing frame period, whether or not the sensor driver is synchronized with a timing signal of a pixel part, or a voltage of the sensing signal, is different in the second mode and the third mode.

DETAILED DESCRIPTION OF THE EMBODIMENTS

Figure 1:
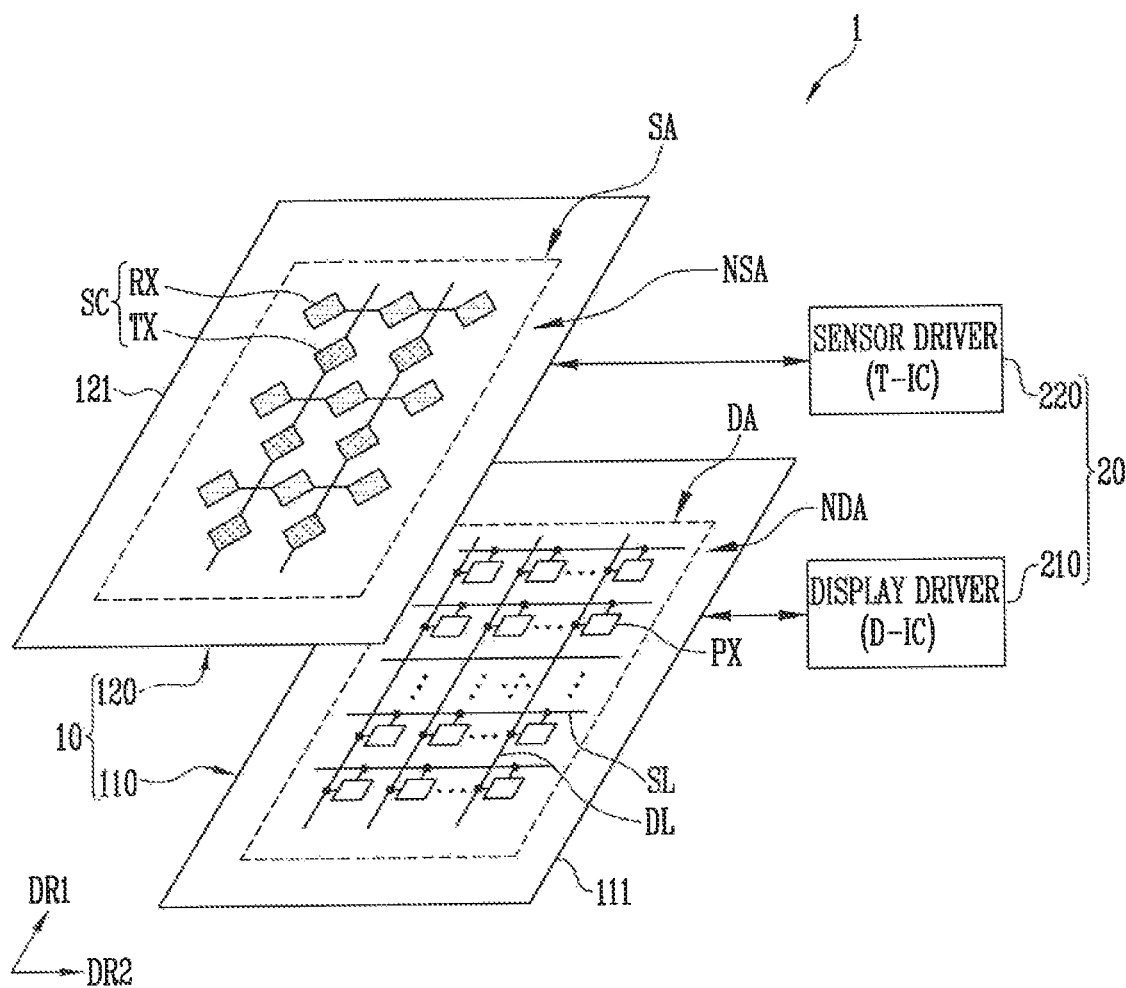
FIG. 1 is a drawing for explaining a display device according to an embodiment of the present invention.

Embodiments of the present invention will be described more fully hereinafter with reference to the accompanying drawings. As those skilled in the art would realize, the present invention may be modified in various different ways, and should not be construed as limited to the embodiments set forth herein.

In order to clearly describe the present invention, parts that were already described in one embodiment may not be re-described in another embodiment. In addition, like reference numerals may refer to like elements throughout the description and drawings.

Further, in the drawings, dimensions of each element may be exaggerated for clarity.

In the following description, the expression "equal to or the same as" may mean "substantially equal to or the same as".

FIG. 1 is a drawing for explaining a display device according to an embodiment of the present invention.

Referring to FIG. 1, a display device 1 according to an embodiment of the present invention may include a panel 10 and a driving circuit part 20 for driving the panel 10.

For example, the panel 10 may include a display part 110 for displaying an image and a sensor part 120 for sensing touch, pressure, fingerprint, and hovering. For example, the panel 10 may include pixels PX, and sensors SC disposed to overlap at least some of the pixels PX. In the present embodiment, the sensors SC may include first sensors TX and second sensors RX. In another embodiment of the present invention (for example, a self-capacitance method), the sensors SC may be configured as one type of sensors without distinction between the first sensors and the second sensors. The driving circuit part 20 may include a display driver 210 for driving the display part 110 and a sensor driver 220 for driving the sensor part 120. For example, the pixels PX may display an image in units of a display frame period. For example, the sensors SC may sense a user input in units of a sensing frame period. The sensing frame period and the display frame period may be independent of each other and may be different from each other. The sensing frame period and the display frame period may be synchronized, or may not be synchronized.

In some embodiments of the present invention, the display part 110 and the sensor part 120 may be separately manufactured, and then may be disposed and/or be combined so that at least one area of the display part 110 and the second part 120 overlap each other. Alternatively, in another embodiment of the present invention, the display part 110 and the sensor part 120 may be integrally manufactured. For example, the sensor part 120 may be directly formed on at least one substrate (for example, an upper and/or lower substrate of a display panel, or a thin film encapsulation layer) forming the display part 110 or other insulation layers or various functional films (for example, an optical layer or a passivation layer).

In FIG. 1, the sensor part 120 is shown to be disposed on a front surface (for example, an upper surface on which an image is displayed) of the display part 110, but the position of the sensor part 120 is not limited thereto. For example, in another embodiment of the present invention, the sensor part 120 may be disposed on a rear surface or other surfaces of the display part 110. In another embodiment of the present invention, the sensor part 120 may be disposed on at least one edge area of the display part 110.

The display part 110 may include a display substrate 111 and a plurality of pixels PX formed on the display substrate 111. The pixels PX may be disposed in a display area DA of the display substrate 111.

The display substrate 111 may include the display area DA in which an image is displayed and a non-display area NDA outside the display area DA. In some embodiments of the present invention, the display area DA may be disposed in a central area of the display part 110, and the non-display area NDA may be disposed in an edge area of the display part 110 to surround the display area DA.

The display substrate 111 may be a rigid substrate or a flexible substrate, and its material or physical properties are not particularly limited. For example, the display substrate 111 may be a rigid substrate made of glass or tempered glass, or a flexible substrate formed of a thin film made of plastic or a metallic material.

In the display area DA, scan lines SL and data lines DL, and the pixels PX connected to the scan lines SL and the data lines DL are disposed. The pixels PX are selected by a scan signal of a turn-on level supplied from the scan lines SL to receive a data signal from the data lines DL, and emit light with a luminance corresponding to the data signal. Accordingly, an image corresponding to the data signal is displayed in the display area DA. In the present invention, the structure and driving method of pixels PX are not particularly limited. For example, the pixels PX may be implemented with various structures and driving methods.

In the non-display area NDA, various wires connected to the pixels PX of the display area DA, and/or internal circuit parts may be disposed. For example, in the non-display area NDA, a plurality of wires for supplying various power sources and control signals to the display area DA may be disposed, and in addition, a scan driver and the like may be further disposed.

In the present invention, the type of the display part 110 is not particularly limited. For example, the display part 110 may be a self light emitting type display panel such as an organic light emitting display panel. However, when the display part 110 is a self-light emitting type, each pixel PX is not limited to a case where only an organic light emitting element is included. For example, the light emitting element of each pixel PX may include an organic light emitting diode, an inorganic light emitting diode, and/or a quantum dot/well light emitting diode. Each pixel PX may be provided with a plurality of light emitting elements. In this case, the plurality of light emitting elements may be connected in series, in parallel, or in series/parallel. Alternatively, the display part 110 may be a non-light emitting type of display panel such as a liquid crystal display panel. When the display part 110 is a non-light emitting type, the display device 1 may additionally include a light source such as a back-light unit.

The sensor part 120 includes a sensor substrate 121 and the plurality of sensors SC formed on the sensor substrate 121. The sensors SC may be disposed in a sensing area SA on the sensor substrate 121.

The sensor substrate 121 may include the sensing area SA capable of sensing a touch input or the like, and a peripheral area NSA outside the sensing area SA. In some embodiments of the present invention, the sensing area SA may overlap at least one area of the display area DA. For example, the sensing area SA may correspond to the display area DA (for example, the sensing area SA may entirely overlap the display area DA), and the peripheral area NSA may correspond to the non-display area NDA (for example, the peripheral area NSA may entirely overlap the non-display area NDA). In this case, when a touch input or the like is provided on the display area DA, it is possible to detect the touch input through the sensor part 120.

The sensor substrate 121 may be a rigid or flexible substrate, and may be configured as at least one insulation layer. In addition, the sensor substrate 121 may be a transparent or translucent transmissive substrate, but is not limited thereto. In other words, in the present invention, the material and physical properties of the sensor substrate 121 are not particularly limited. For example, the sensor substrate 121 may be a rigid substrate made of glass or tempered glass, or a flexible substrate formed of a thin film made of plastic or a metallic material. In addition, in some embodiments of the present invention, at least one substrate forming the display part 110 (for example, the display substrate 111, an encapsulation substrate and/or a thin film encapsulation layer), or at least one layer of an insulation film or a functional film disposed on an inner and/or outer surface of the display part 110, may be used as the sensor substrate 121.

The sensing area SA is capable of reacting to a touch input (in other words, an active area of a sensor). To accomplish this, the sensors SC for sensing the touch input or the like may be disposed in the sensing area SA. In some embodiments of the present invention, the sensors SC may include the first sensors TX and the second sensors RX.

For example, the first sensors TX may extend in a first direction DR1. The first sensors TX may be arranged in a second direction DR2. The second direction DR2 may be different from the first direction DR1. For example, the second direction DR2 may be a direction orthogonal to the first direction DR1. In another embodiment of the present invention, the extension direction and arrangement direction of the first sensors TX may have other configurations. Each of the first sensors TX may have a structure in which first cells having a relatively large area and first bridges having a relatively narrow area are connected to each other. In FIG. each first cell is illustrated in a diamond shape, but may be configured in various shapes such as a circle, a quadrangle, a triangle, and a mesh form. For example, the first bridges may be integrally formed on the same layer as the first cells. In another embodiment of the present invention, the first bridges may be formed in a different layer from the first cells to electrically connect adjacent first cells.

For example, each second sensor RX may extend in the second direction DR2. The second sensors RX may be arranged in the first direction DR1. In another embodiment of the present invention, the extension direction and arrangement direction of the second sensors RX may have other configurations. Each second sensor RX may have a structure in which second cells having a relatively large area and second bridges having a relatively narrow area are connected to each other. In FIG. 1, each second cell is illustrated in a diamond shape, but may be configured in various shapes such as a circle, a quadrangle, a triangle, and a mesh form. For example, the second bridges may be integrally formed on the same layer as the second cells. In another embodiment of the present invention, the second bridges may be formed in a different layer from the second cells to electrically connect adjacent second cells.

In some embodiments of the present invention, each of the first sensors TX and of the second sensors RX may have conductivity by including at least one of a metallic material, a transparent conductive material, and various other conductive materials. For example, the first sensors TX and the second sensors RX may include at least one of various metallic materials such as gold (Au), silver (Ag), aluminum (Al), molybdenum (Mo), chromium (Cr), titanium (Ti), nickel (Ni), neodymium (Nd), copper (Cu), and platinum (Pt), or an alloy thereof. In this case, the first sensors TX and the second sensors RX may be configured in a mesh form. In addition, the first sensors TX and the second sensors RX may include at least one of various transparent conductive materials such as a silver nanowire (AgNW), an indium tin oxide (ITO), an indium zinc oxide (IZO), an indium gallium zinc oxide (IGZO), an antimony zinc oxide (AZO), an indium tin zinc oxide (ITZO), a zinc oxide (ZnO), a tin oxide (SnO2), a carbon nano tube, and a graphene. In addition, the first sensors TX and the second sensors RX may have conductivity by including at least one of various conductive materials. In addition, each of the first sensors TX and the second sensors RX may be made of a single layer or multilayer, and the cross-sectional structure thereof is not particularly limited.

In the peripheral area NSA of the sensor part 120, sensor lines for electrically connecting the sensors TX and RX to the sensor driver 220 and the like may be disposed.

The driving circuit part 20 may include the display driver 210 for driving the display part 110 and the sensor driver 220 for driving the sensor part 120. In the present embodiment, the display driver 210 and the sensor driver 220 may be configured of separate integrated chips from each other. In another embodiment of the present invention, at least a portion of the display driver 210 and the sensor driver 220 may be integrated together in one integrated circuit (IC).

The display driver 210 is electrically connected to the display part 110 to drive the pixels PX. For example, the display driver 210 may include a data driver 12 and a timing controller 11, and a scan driver 13 may be separately mounted in the non-display area NDA of the display part 110 (see FIG. 20). In another embodiment of the present invention, the display driver 210 may include all or at least some of the data driver 12, the timing controller 11, and the scan driver 13.

The sensor driver 220 is electrically connected to the sensor part 120 to drive the sensor part 120. The sensor driver 220 may include a sensor transmitter and a sensor receiver. In some embodiments of the present invention, the sensor transmitter and the sensor receiver may be integrated into one IC, but the present invention is not limited thereto.

Figure 2:
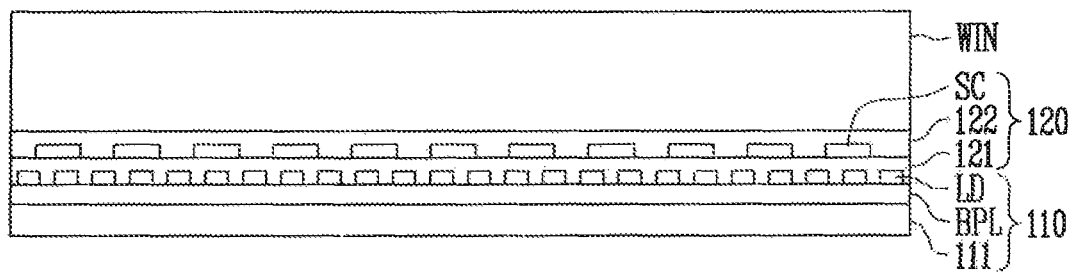
FIG. 2 is a drawing for explaining an example stacked structure of the display device of FIG. 1.

FIG. 2 is a drawing for explaining an example stacked structure of the display device of FIG. 1.

Referring to FIG. 2, for example, the sensor part 120 may be stacked on the display part 110, and a window WIN may be stacked on the sensor part 120.

The display part 110 may include the display substrate 111, a circuit element layer BPL formed on the display substrate 111, and light emitting elements LD formed on the circuit element layer BPL. The circuit element layer BPL may include the pixel circuits, the scan lines SL, the data lines DL, and the like for driving the light emitting elements LD of the pixels PX.

The sensor part 120 may include the sensor substrate 121, sensors SC formed on the sensor substrate 121, and a passivation film 122 covering the sensors SC. For example, the passivation film 122 may cover the sensors SC and contact the sensor substrate 121 between adjacent sensors SC. In FIG. 2, the sensor substrate 121 is shown in a form of an encapsulation film covering the pixels PX. For example, the sensor substrate 121 may cover the light emitting elements LD and contact the circuit element layer BPL between adjacent light emitting elements LD. In another embodiment of the present invention, the sensor substrate 121 may exist separately from the encapsulation film covering the pixels PXL.

The window WIN may be a protective member disposed at an uppermost portion of the display device 1, and may be a substantially transparent transmissive substrate. The window WIN may have a multi-layered structure selected from a glass substrate, a plastic film, and a plastic substrate. The window WIN may include a rigid or flexible substrate, and the material included in the window WIN is not particularly limited.

The display device 1 may further include a polarizing plate (or another type of anti-reflection layer) for preventing reflection of external light between the window WIN and the sensor part 120.

Figure 3:
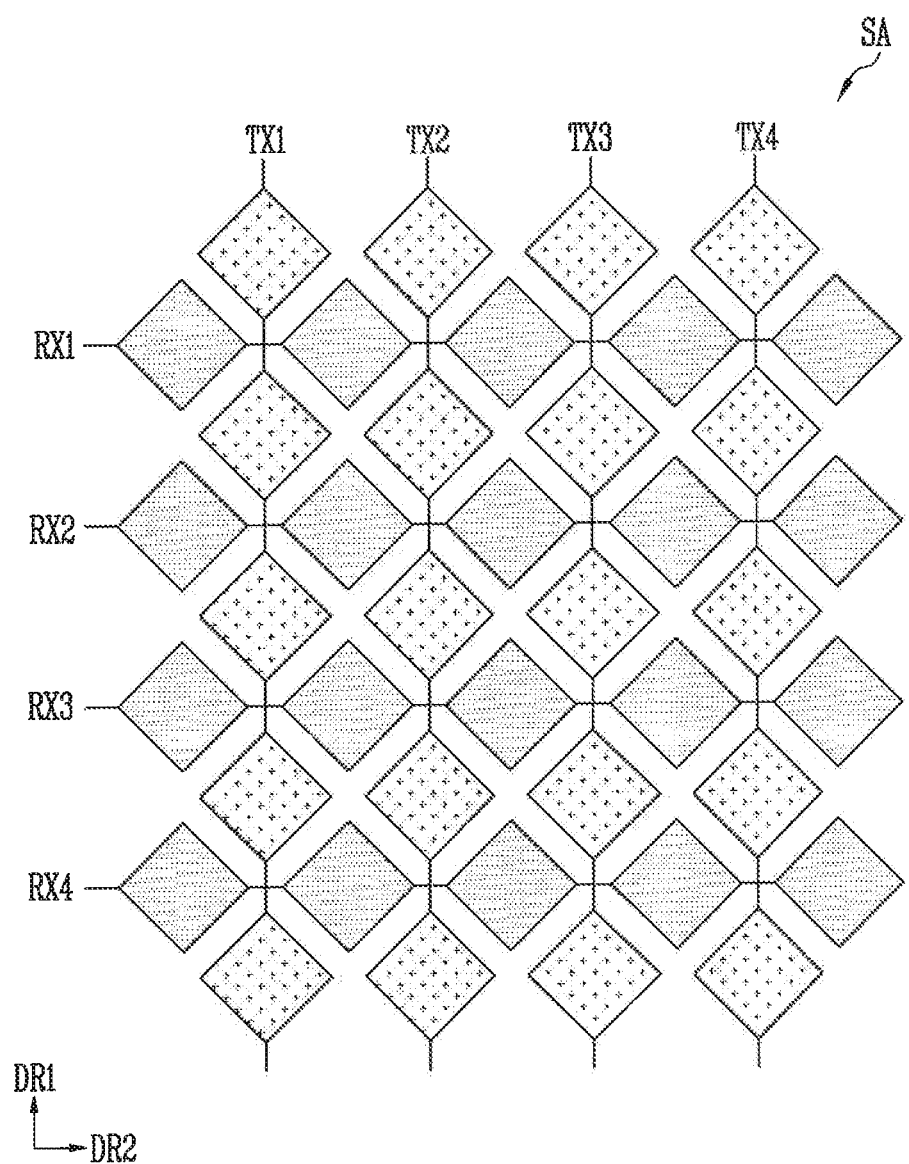
FIG. 3 is a drawing for explaining first sensors and second sensors according to an embodiment of the present invention.

FIG. 3 is a drawing for explaining first sensors and second sensors according to an embodiment of the present invention.

Referring to FIG. 3, first sensors TX1, TX2, TX3, and TX4 and second sensors RX1, RX2, RX3, and RX4 disposed in the sensing area SA are illustrated as an example. For better understanding and ease of description, it is assumed that four first sensors TX1 to TX4 and four second sensors RX1 to RX4 are disposed in the sensing area SA. In an actual display device, dozens to hundreds of first sensors TX and second sensors RX may be disposed.

Since the description of the first sensors TX1 to TX4 and the second sensors RX1 to RX4 is the same as the description of the first sensors TX and the second sensors RX of FIG. 1, a duplicate description will be omitted.

Figure 4:
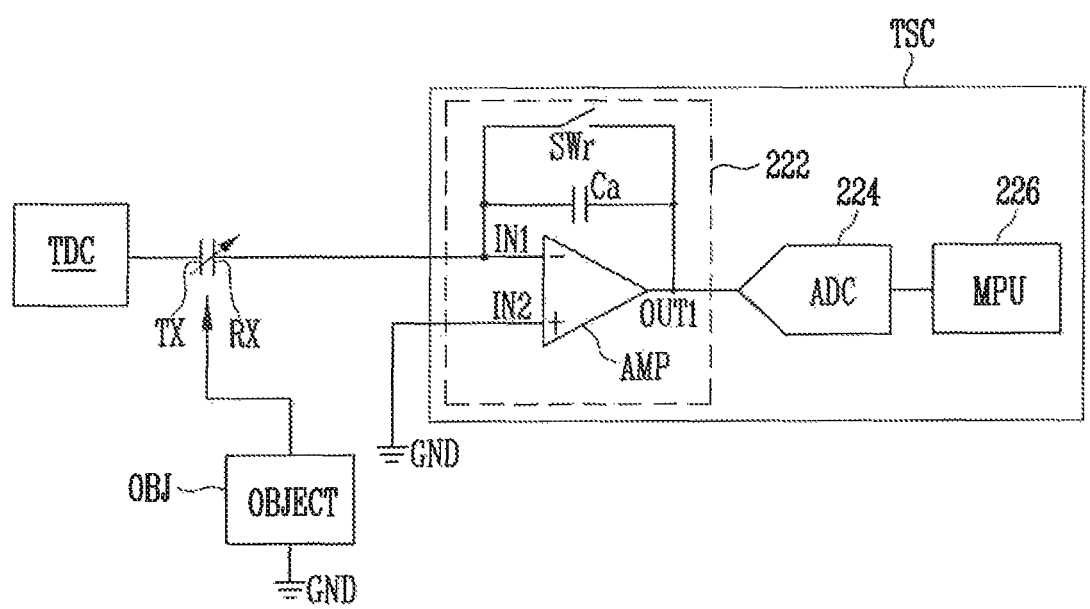
FIG. 4 and FIG. 5 are drawings for explaining a mutual sensing period according to an embodiment of the present invention.
Figure 5:
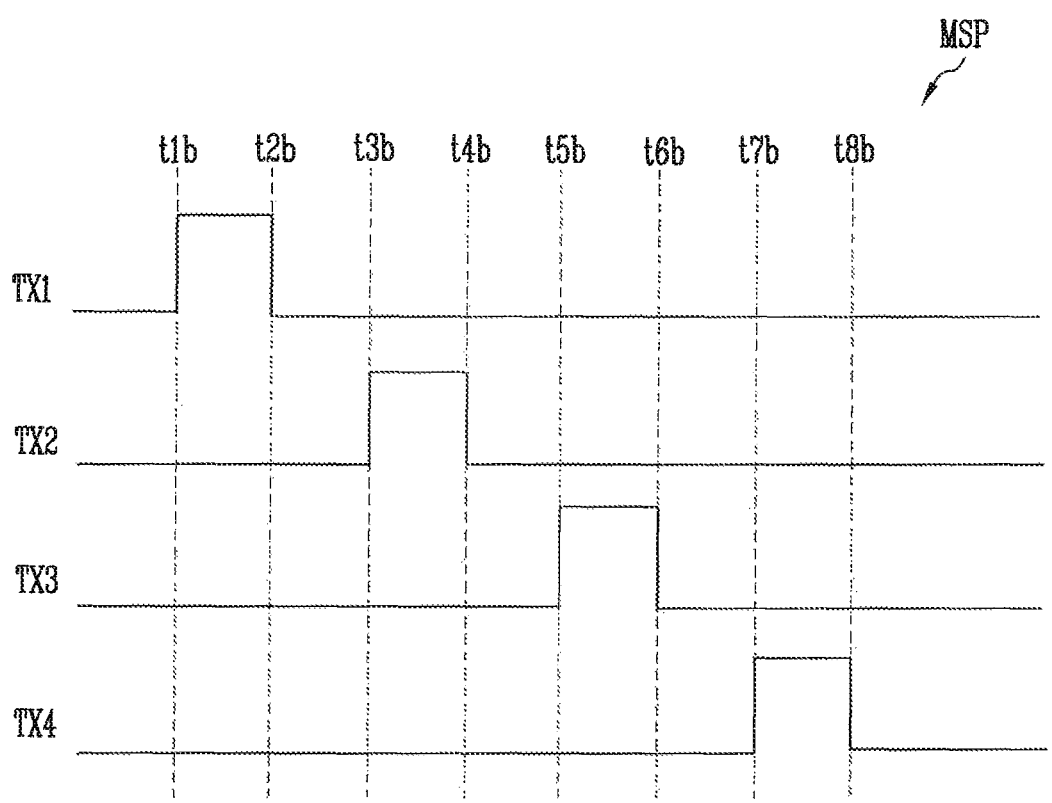

FIG. 4 and FIG. 5 are drawings for explaining a mutual sensing period according to an embodiment of the present invention.

A mutual sensing period MSP may be a period in which the sensor part 120 and the sensor driver 220 are driven in a mutual capacitance mode. In FIG. 4, configurations of the sensor part 120 and the sensor driver 220 is shown based on one sensor channel 222.

The sensor driver 220 may include a sensor receiver TSC and a sensor transmitter TDC. In the mutual sensing period MSP, the sensor transmitter TDC may be connected to the first sensors TX, and the sensor receiver TSC may be connected to the second sensors RX.

The sensor receiver TSC may include an operational amplifier AMP, an analog digital converter 224, and a processor 226. For example, each sensor channel 222 may be implemented as an analog front end (AFE) including at least one operational amplifier AMP. The analog digital converter 224 and the processor 226 may be provided for each sensor channel 222, or may be shared in a plurality of sensor channels 222.

A first input terminal IN1 of the operational amplifier AMP may be connected to a corresponding second sensor RX, and a second input terminal IN2 of the operational amplifier AMP may be connected to a reference power source GND. For example, the first input terminal IN1 may be an inverting terminal, and the second input terminal IN2 may be a non-inverting terminal. The reference power GND may be a ground voltage or a voltage of a specific potential.

The analog digital converter 224 may be connected to an output terminal OUT1 of the operational amplifier AMP. A capacitor Ca and a switch SWr may be connected in parallel between the first input terminal IN1 and the output terminal OUT1.

Referring to FIG. 5, during the mutual sensing period MSP, the sensor driver 220 (for example, the sensor transmitter TDC) may sequentially supply first sensing signals to the first sensors TX1 to TX4. For example, the first sensing signals may be supplied to the first sensor TX1 twice (e.g., at time points t1b and t2b), the first sensing signals may be supplied to the first sensor TX2 twice (e.g., at time points tab and t4b), the first sensing signals may be supplied to the first sensor TX3 twice (e.g., at time points t5b and t6b), and the first sensing signals may be supplied to the first sensor TX4 twice (e.g., at time points t7b and t8b). The number of times of supplying the first sensing signals to each of the first sensors TX1 to TX4 may be more than 2 times in some embodiments of the present invention.

Each of the first sensing signals may correspond to a rising transition and/or a falling transition. For example, the first sensing signal at the time point t1b may correspond to the rising transition. In other words, the first sensing signal at the time point t1b may rise from a low level to a high level. The first sensing signal at the time point t2b may correspond to the falling transition. In other words, the first sensing signal at the time point t2b may fall from a high level to a low level. In some embodiments, however, the first sensing signal at the time point t1b may fall from a high level to a low level, and the first sensing signal at the time point t2b may rise from a low level to a high level.

The sensor receiver TSC may include a plurality of sensor channels 222 connected to a plurality of second sensors RX. Respective sensor channels 222 may receive first sampling signals corresponding to the first sensing signals from a corresponding second sensor RX. For example, in response to the first sensing signal applied to the first sensor TX1 at the time point t1b, the sensor channels 222 connected to the second sensors RX1 to RX4 may independently receive the first sampling signals. In addition, in response to the first sensing signal applied to the first sensor TX1 at the time point t2b, the sensor channels 222 connected to the second sensors RX1 to RX4 may independently receive the first sampling signals.

In the sensing area SA, mutual capacitance between the first sensors TX1 to TX4 and the second sensors RX1 to RX4 may vary depending on a position of an object OBJ such as a user's finger, and accordingly, the first sampling signals received by the sensor channels 222 may be different from each other. The touch position of the object OBJ may be detected by using the difference between the first sampling signals.

The sensor channel 222 may generate an output signal corresponding to a voltage difference between the first and second input terminals IN1 and IN2. For example, the sensor channel 222 may amplify and output the difference in voltage between the first and second input terminals IN1 and IN2 at a degree corresponding to a predetermined gain.

In some embodiments of the present invention, the sensor channel 222 may be implemented as an integrator. In this case, the capacitor Ca and the switch SWr may be connected in parallel to each other between the first input terminal IN1 and the output terminal OUT1 of the operational amplifier AMP, as shown in FIG. 4. For example, the switch SWr is turned on before receiving the first sampling signal, so that charges of the capacitor Ca may be initialized. When the first sampling signal is received, the switch SWr may be in a turned-off state.

The analog digital converter 224 converts an analog signal inputted from each sensor channels 222 into a digital signal. The processor 226 may analyze the digital signal to detect a user input.

Figure 6:
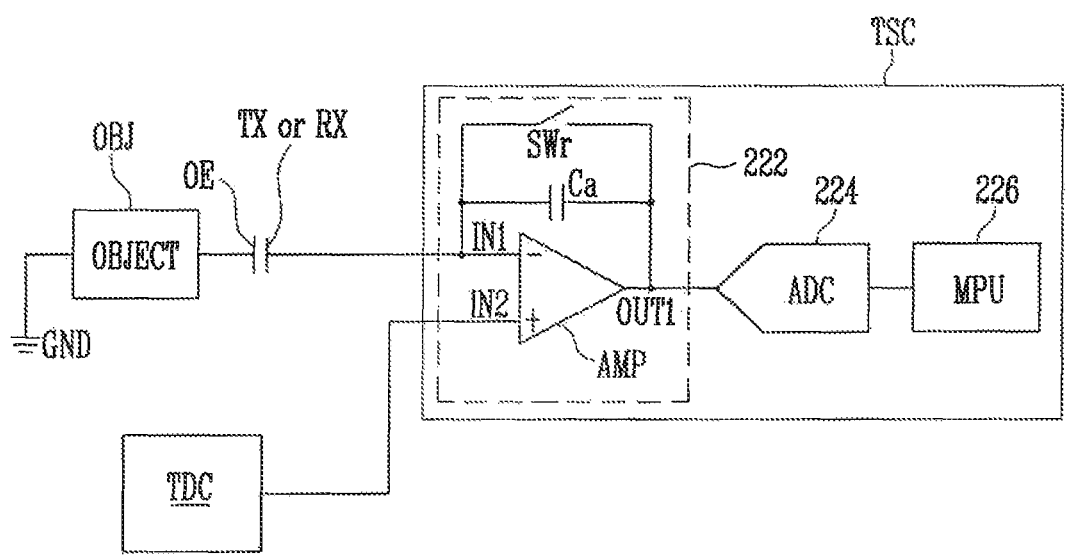
FIG. 6, FIG. 7 and FIG. 8 are drawings for explaining a first self-sensing period and a second self-sensing period according to an embodiment of the present invention.
Figure 7:
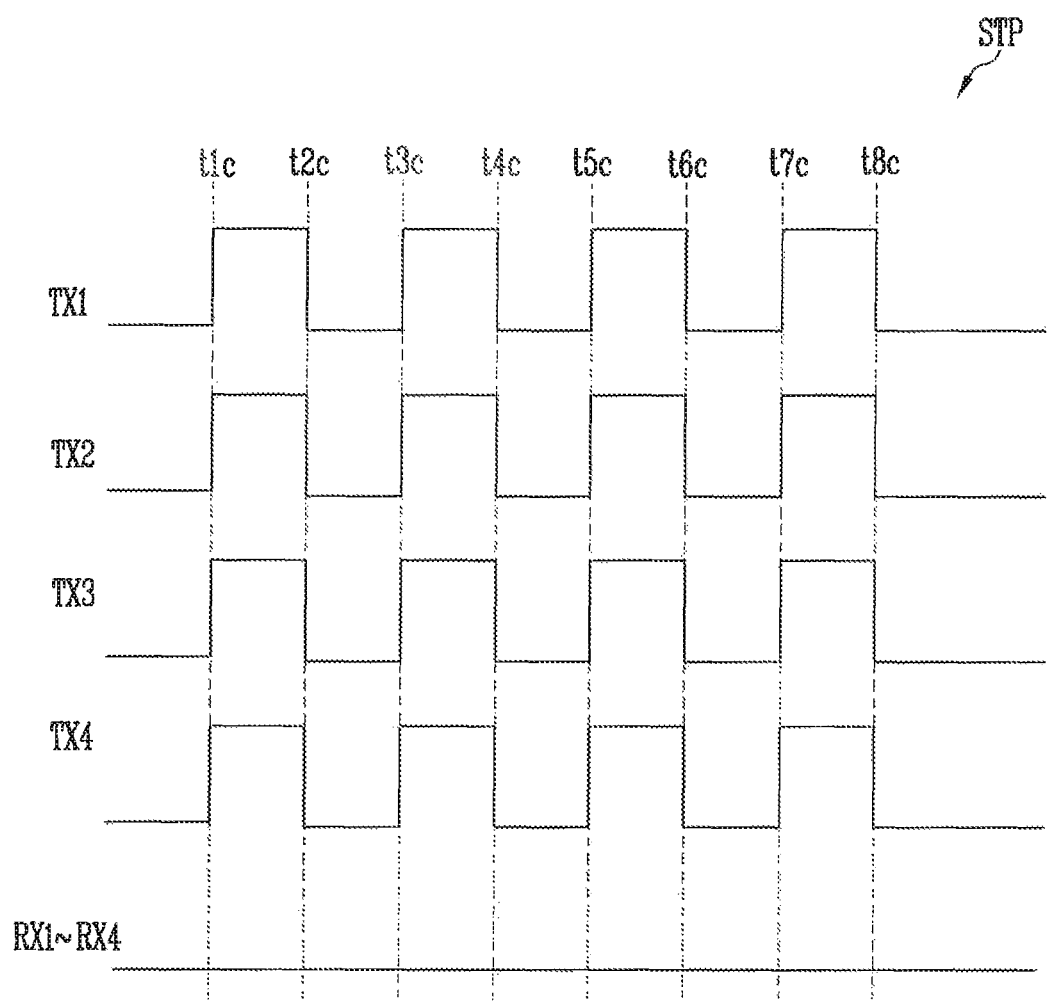
Figure 8:
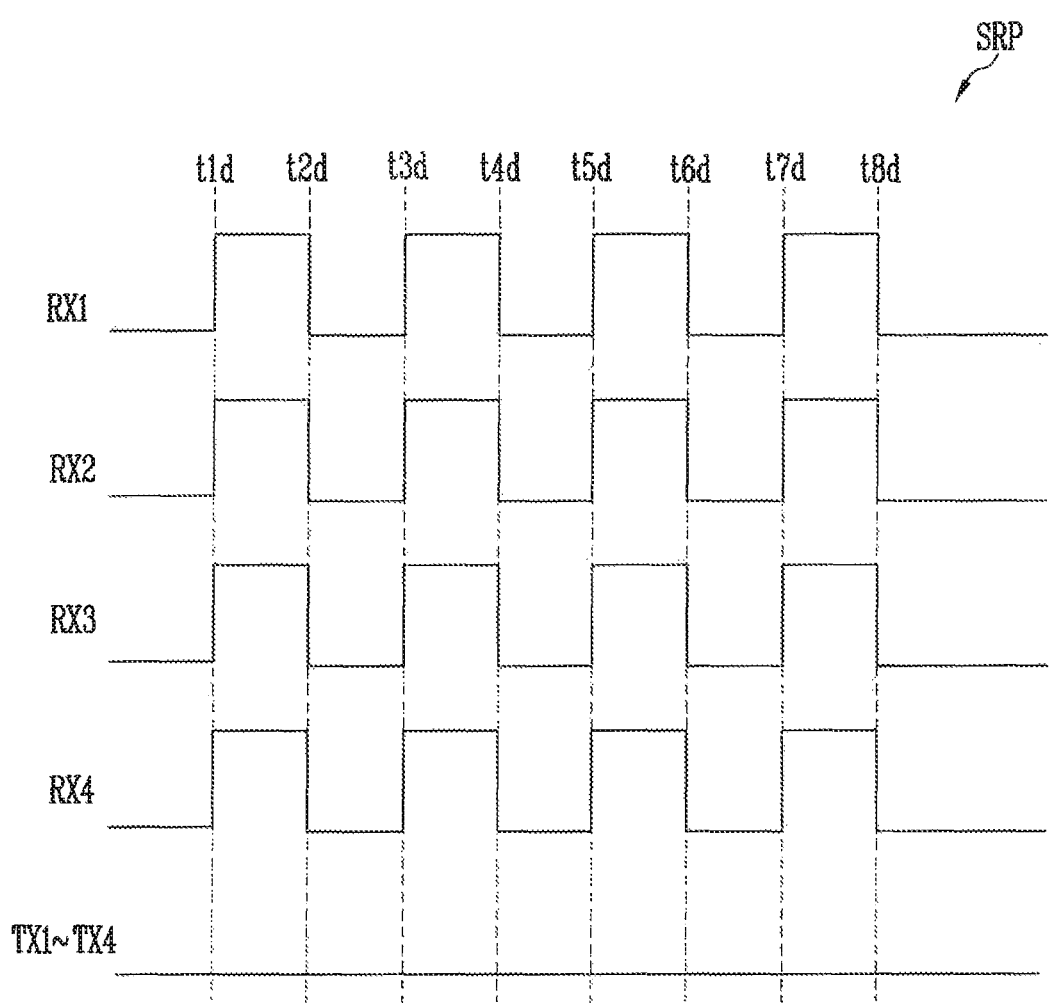

FIG. 6 to FIG. 8 are drawings for explaining a first self-sensing period and a second self-sensing period according to an embodiment of the present invention.

FIG. 6 illustrates constituent elements of the sensor part 120 and the sensor driver 220 based on one sensor channel 222. Internal configurations of the sensor receiver TSC and the sensor transmitter TDC may be substantially equivalent to those of FIG. 4. A duplicate description thereof will be omitted, and differences therebetween will be mainly described below.

Referring to FIG. 7, a first self-sensing period STP may be a period in which the sensor part 120 and the sensor driver 220 are driven in a self-capacitance mode. In the first self-sensing period STP, the sensor transmitter TDC may be connected to the second input terminal IN2 of each sensor channel 222, and the corresponding first sensor TX may be connected to the first input terminal IN1 of each sensor channel 222. In another embodiment of the present invention, the sensor transmitter TDC may be connected to the first input terminal IN1. In this case, a reference voltage or a ground voltage may be applied to the second input terminal IN2.

For example, during the first self-sensing period STP, the sensor transmitter TDC may supply a second sensing signal to the second input terminal IN2 of each sensor channel 222. In this case, the second sensing signal may be supplied to the first sensor TX connected to the first input terminal IN1 according to the characteristic of the operational amplifier AMP. In the present embodiment, the sensor driver 220 may simultaneously supply the second sensing signals to the first sensors TX1 to TX4 during the first self-sensing period STP. For example, referring to FIG. 7, the second sensing signals at respective time points t1c, t2c, t1c, t4c, t5c, t6c, t7c, and t8c may be simultaneously supplied to the first sensors TX1 to TX4. For example, the sensing signals may be supplied to each of the first sensors TX1 to TX4 at the time point t1c.

In addition, the sensing signals may be supplied to each of the first sensors TX1 to TX4 at the time point t2c. In this case, the second sensors RX1 to RX4 may receive a separate reference voltage, or may be in a floating state. Respective second sensing signals may correspond to a rising transition and/or a falling transition.

The first sensors TX1 to TX4 may have self-capacitance. In this case, when the object OBJ such as a user's finger approaches the first sensors TX1 to TX4, self-capacitance of the first sensors TX1 to TX4 may vary according to a capacitance formed between a surface OE of the object OBJ and the sensors TX. The second sensing signal to which the self-capacitance is reflected may be referred to as a second sampling signal. A touch position of the object OBJ in the second direction DR2 may be detected by using the difference between the second sampling signals for the first sensors TX1 to TX4 (see FIG. 3).

Referring to FIG. 8, a second self-sensing period SRP may be a period in which the sensor part 120 and the sensor driver 220 are driven in a self-capacitance mode. In the second self-sensing period SRP, the sensor transmitter TDC may be connected to the second input terminal IN2 of each sensor channel 222, and the corresponding second sensor RX may be connected to the first input terminal IN1 of each sensor channel 222.

For example, during the second self-sensing period SRP, the sensor transmitter TDC may supply a third sensing signal to the second input terminal IN2 of each sensor channel 222. In this case, the third sensing signal may be supplied to the second sensor RX connected to the first input terminal IN1 according to the characteristic of the operational amplifier AMP. In the present embodiment, the sensor driver 220 may simultaneously supply the third sensing signals to the second sensors RX1 to RX4 during the second self-sensing period SRP. For example, referring to FIG. 8, the third sensing signals at respective time points t1d, t2d, t3d, t4d, t5d, t6d, t7d, and t8d may be simultaneously supplied to the second sensors RX1 to RX4. In this case, the first sensors TX1 to TX4 may receive a separate reference voltage, or may be in a floating state. Respective third sensing signals may correspond to a rising transition or a falling transition.

The second sensors RX1 to RX4 may have self-capacitance. In this case, when the object OBJ such as a user's finger approaches the second sensors RX1 to RX4, self-capacitance of the second sensors RX1 to RX4 may vary according to a capacitance formed between the surface OE of the object OBJ and the sensors RX. The third sensing signal to which the self-capacitance is reflected may be referred to as a third sampling signal. A touch position of the object OBJ in the first direction DR1 may be detected by using the difference between the third sampling signals for the second sensors RX1 to RX4 (see FIG. 3).

Figure 9:
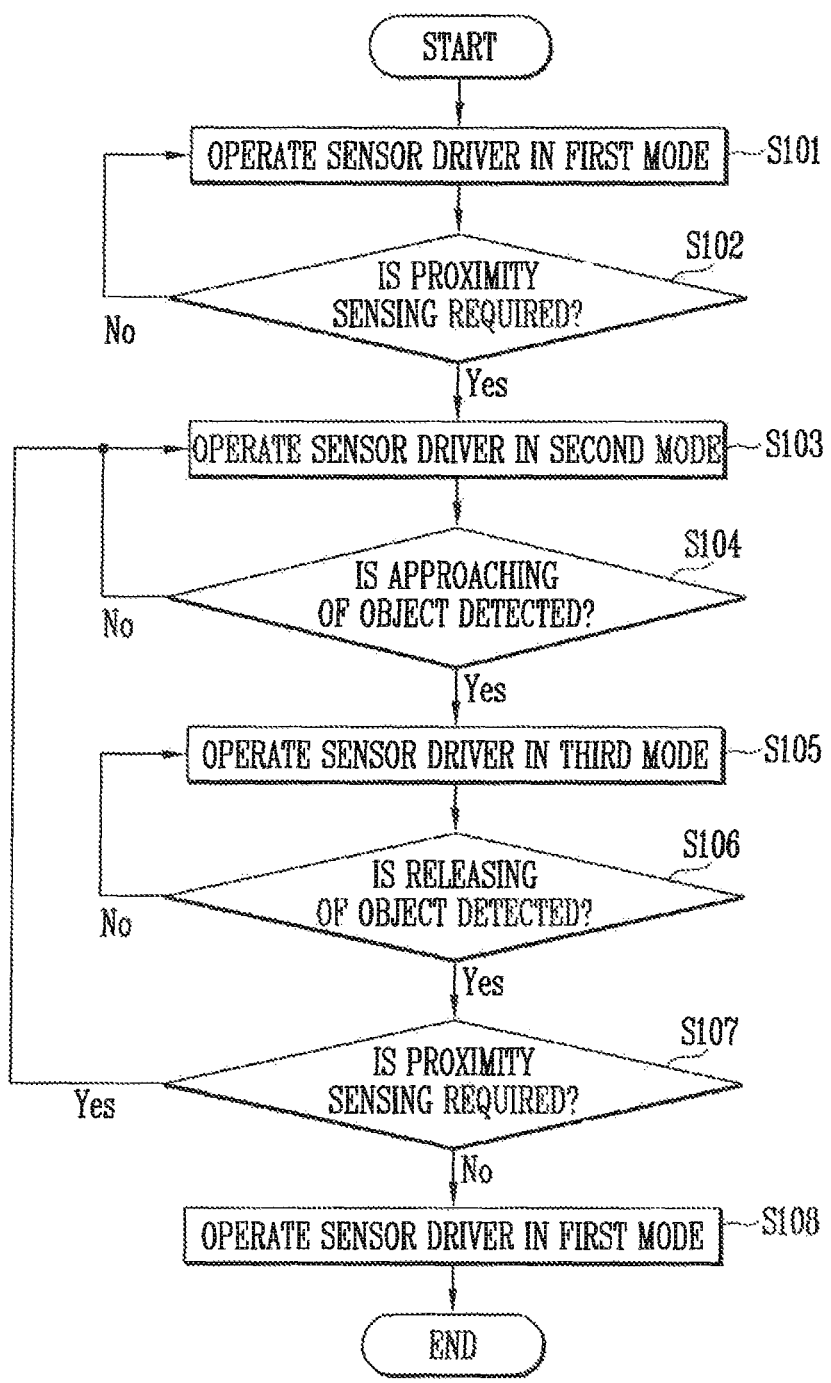
FIG. 9 is a drawing for explaining a driving method of a display device according to an embodiment of the present invention.
Figure 10:
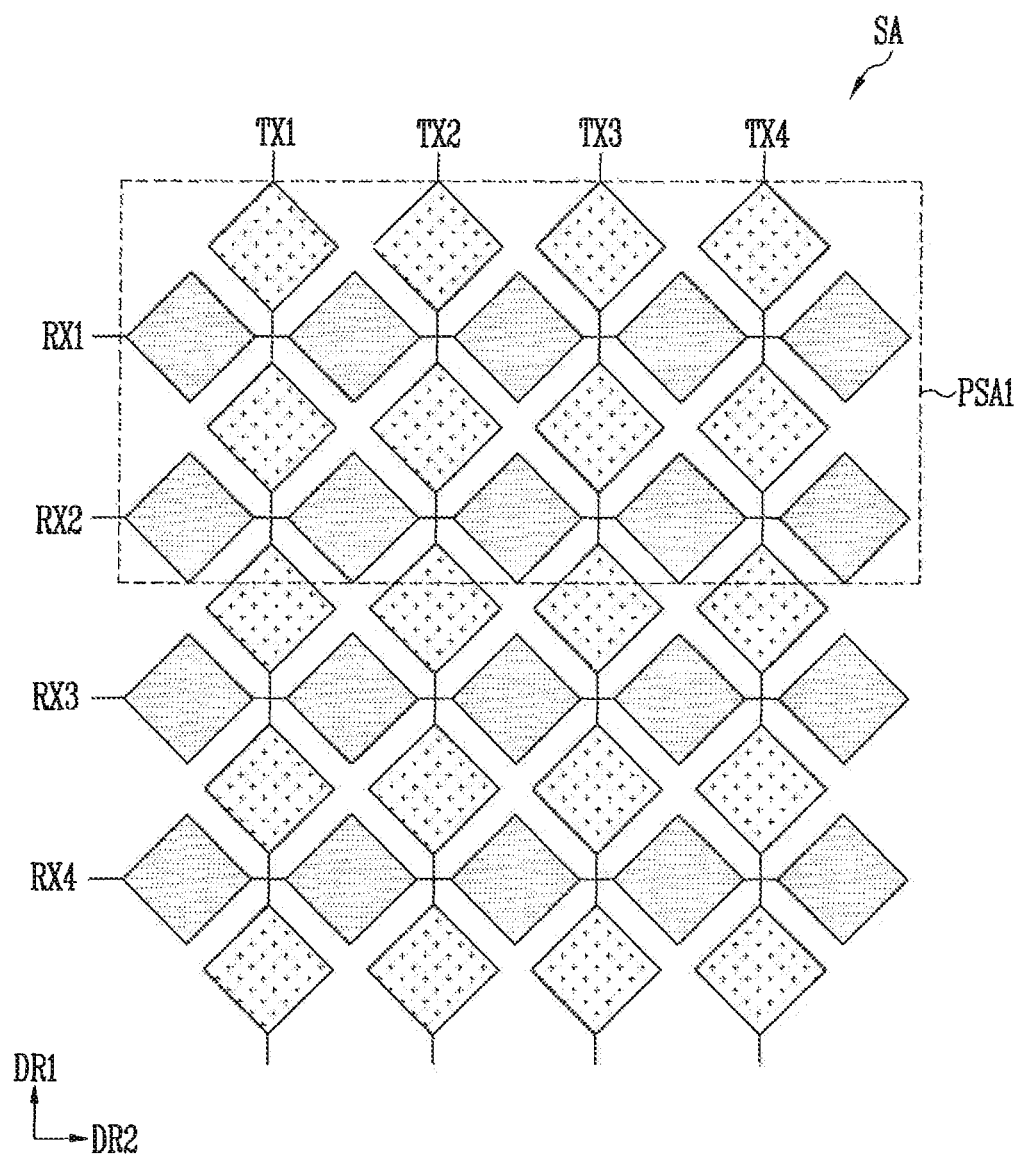
FIG. 10 is a drawing for explaining a first area according to an embodiment of the present invention.
Figure 11:
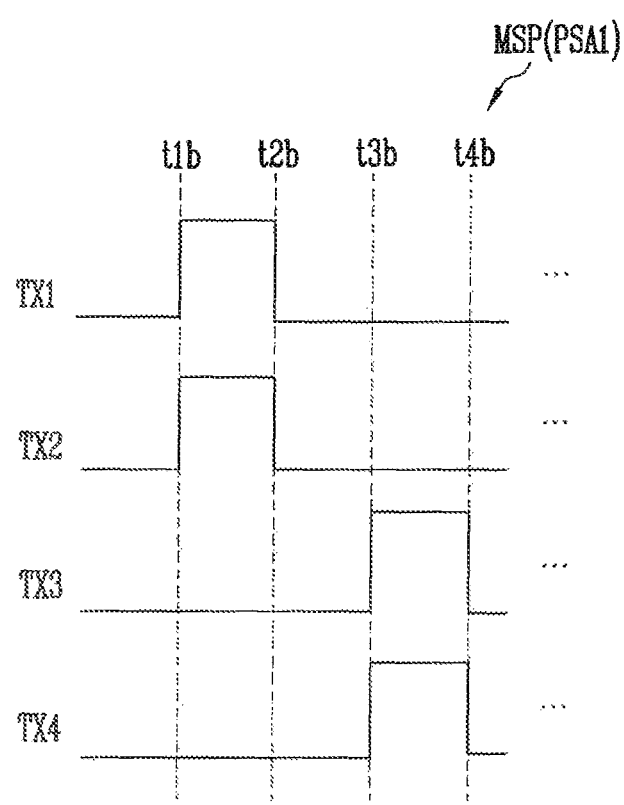
FIG. 11 and FIG. 12 are drawings for explaining a sensing method of a first area in a second mode and a third mode.
Figure 12:
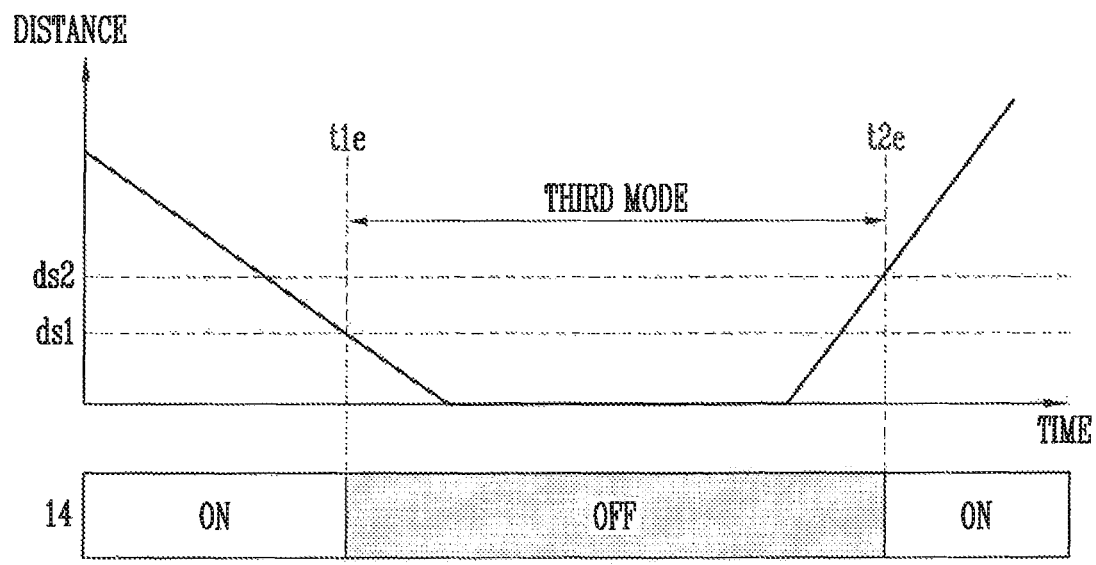

FIG. 9 is a drawing for explaining a driving method of a display device according to an embodiment of the present invention. FIG. 10 is a drawing for explaining a first area according to an embodiment of the present invention. FIG. 11 and FIG. 12 are drawings for explaining a sensing method of a first area in a second mode and a third mode.

First, the sensor driver 220 may operate in the first mode (S101). The first mode may be a mode for sensing a touch position. For example, the sensor driver 220 may determine at which position (or coordinates) of the sensor part 120 a touch of the object OBJ occurs according to a sensing frequency (or a report rate). For example, when the sensing frequency is 120 Hz, the sensor driver 220 may generate touch coordinates 120 times per second. A sensing frame period is a period for generating one touch coordinate, and may correspond to the reciprocal of the sensing frequency. For example, when the sensing frequency is 120 Hz, the sensing frame period may be $\frac{1}{120}$ second.

In the first mode, the sensor driver 220 may operate according to at least one of the mutual sensing period MSP, the first self-sensing period STP, and the second self-sensing period SRP for the entire sensing area SA of the sensor part 120 (see FIG. 5, FIG. 7, and FIG. 8). In other words, in the first mode, each sensing frame period may include at least one of the mutual sensing period MSP, the first self-sensing period STP, and the second self-sensing period SRP.

The sensor driver 220 may transmit a sensing signal in units of p sensors to a first area PSA1 of the sensor part 120 in the first mode. In other words, the sensor driver 220 may transmit a sensing signal to p sensors in each sensing time in a first area PSA1 of the sensor part 120 in the first mode comprising a plurality of sensing times. The first area PSA1 is a portion of the sensing area SA, and an initial position thereof may be preset for proximity sensing. For example, the first area PSA1 may be a portion expected to be touched by a user's ear or cheek. In the first mode, the proximity sensing is unnecessary. Accordingly, the sensor driver 220 may transmit a sensing signal to the entire sensing area SA of the sensor part 120 as well as the first area PSA1 of the sensor part 120 in units of p sensors in the first mode.

p may be an integer larger than zero. For example, referring to FIG. 5, since the sensing signals are transmitted to each first sensor TX at different timings in the mutual sensing period MSP, p may be 1. In an actual display device in which tens to hundreds of the first sensors TX are provided, p may be approximately 4. For example, the sensing signals may be simultaneously supplied to four first sensors TX1 to TX4, and then the sensing signals may be simultaneously supplied to next four first sensors, e.g., TX5 to TX8.

While the display device 1 is operating in the first mode, there may be a case where the proximity sensing is required (S102). For example, proximity sensing may be required when the user presses a call button in a phone application of the display device 1.

When it is determined that the proximity sensing is necessary, the sensor driver 220 may operate in the second mode (S103). The second mode may be a mode for detecting that an object is approaching during the proximity sensing. For example, the sensor driver 220 may perform the proximity sensing on the first area PSA1 in the second mode (see FIG. 11). For example, in the second mode, the sensor driver 220 may perform touch position sensing in an area other than the first area PSA1 of the sensing area SA (see FIG. 5, FIG. 7, and FIG. 8). In the second mode, the touch position sensing and the proximity sensing may be variously combined temporally/spatially according to embodiments of the present invention.

The sensor driver 220 may transmit a sensing signal to the first area PSA1 in units of q sensors in the second mode. In other words, the sensor driver 220 may transmit a sensing signal to q sensors in each sensing time in the first area PSA1 in the second mode comprising a plurality of sensing times. In this case, the first area PSA1 may be referred to as a proximity sensing area. In the proximity sensing, it is more important to determine a separation distance between the object OBJ and the sensor part 120 than to determine a touch position. Of course, even in the case of the proximity sensing, determining the separation distance between the object OBJ and the sensor part 120 is tougher than sensing the touch position, but the sensor driver 220 may nevertheless determine the touch position. q may be an integer larger than p. For example, referring to FIG. 11, q may be 2. Referring to FIG. 11, first, the sensing signals may be supplied to two first sensors TX1 and TX2 (e.g., at time points t1b and t2b), and then the sensing signals may be supplied to two first sensors TX3 and TX4 (t3b and t4b). For example, the sensing signals may be simultaneously supplied to the first sensors TX1 and TX2 at the first time point t1b and then the second time point t2b. An electric field at each time point is stronger in the proximity sensing according to the present embodiment than in the touch position sensing (compare FIG. 5 and FIG. 11), and accordingly, it is possible to calculate the distance between the sensor part 120 and the object OBJ even when the object OBJ is hovering. In an actual display device in which tens to hundreds of the first sensors TX are provided, q may be approximately 10. For example, the sensing signals may be simultaneously supplied to ten first sensors TX, and then the sensing signals may be simultaneously supplied to next ten first sensors. In the present embodiment, the mutual capacitance mode is used for the proximity sensing, and the self-capacitance mode may be used in another embodiment of the present invention.

The sensor driver 220 may detect the approach of the object OBJ while operating in the second mode (S104). Referring to FIG. 12, an example distance graph per time between the sensor part 120 and the object OBJ detected by the sensor part 120 is shown. For example, at a time point t1e when the distance between the sensor part 120 and the object OBJ corresponds to a first threshold distance ds1, the sensor driver 220 may determine that the object OBJ sufficiently approaches. Until the time point t1e, a pixel part 14 may display an image (e.g., a display state). After the time point t1e, the pixel part 14 may not display an image (e.g., a non-display state). For example, when the user's ear or cheek are close to the first area PSA1, the user cannot view the pixel part 14, so it is not a problem if the pixel part 14 does not display an image.

When the proximity of the object OBJ is detected, the sensor driver 220 may operate in the third mode (S105). The third mode may be a mode for detecting that an object is released during the proximity sensing. In other words, the third mode may be a mode for determining that the object is no longer within a distance threshold for proximity sensing. For example, the sensor driver 220 may perform the proximity sensing in the first area PSA1 in the third mode (see FIG. 11). However, in the third mode, the sensor driver 220 may not perform any sensing in an area other than the first area PSA1 of the sensing area SA. For example, during the third mode, the user can continue the call with his or her ear or cheek on the display device 1, so that no interaction is expected until a call is finished.

The sensor driver 220 may transmit a sensing signal to the first area PSA1 in units of r sensors in the third mode. In other words, the sensor driver 220 may transmit a sensing signal to r sensors in each sensing time in the first area PSA1 in the third mode comprising a plurality of sensing times. r may be an integer larger than p. For example, referring to FIG. 11, r may be 2. Referring to FIG. 11, first, the sensing signals may be supplied to two first sensors TX1 and TX2 (e.g., time points t1b and t2b), and then the sensing signals may be supplied to two first sensors TX3 and TX4 (e.g., time points t3b and t4b). A gap may exist between the time point t2b and t3b, and in this time period, no sensing signals may be transmitted.

q in the second mode and r in the third mode may be the same. In another embodiment of the present invention, q and r may be different. For example, r may be larger than q.

Accordingly, the releasing of the object OBJ in the third mode may be detected more quickly and accurately than the detecting of the proximity of the object OBJ in the second mode.

The sensor driver 220 may detect the releasing of the object OBJ while operating in the third mode (S106). For example, referring to FIG. 12, at a time point t2e when the distance between the sensor part 120 and the object OBJ corresponds to a second threshold distance ds2, the sensor driver 220 may determine that the object OBJ is sufficiently released. In the present embodiment, the second threshold distance ds2 may be greater than the first threshold distance ds1. Accordingly, the third mode may not be released to an extent that the user unintentionally moves their body away from the display device 1 during a call, thereby improving the user's convenience. After the time point t2e, the pixel part 14 may display an image (e.g., a display state).

After the time point t2e, the sensor driver 220 may operate in the first mode (S107 and S108) or in the second mode (S107 and S103) according to a scenario of the display device 1.

According to the present embodiment, the sensor driver 220 may differently set at least one of the sensing frequency, the first area PSA1, the number of sensing times per sensing frame period, whether or not synchronized with the timing signal of the pixel part 14, and the voltage level of the sensing signal in the second mode and the third mode. This will be described in detail with reference to FIG. 10 to FIG. 24.

Figure 13:
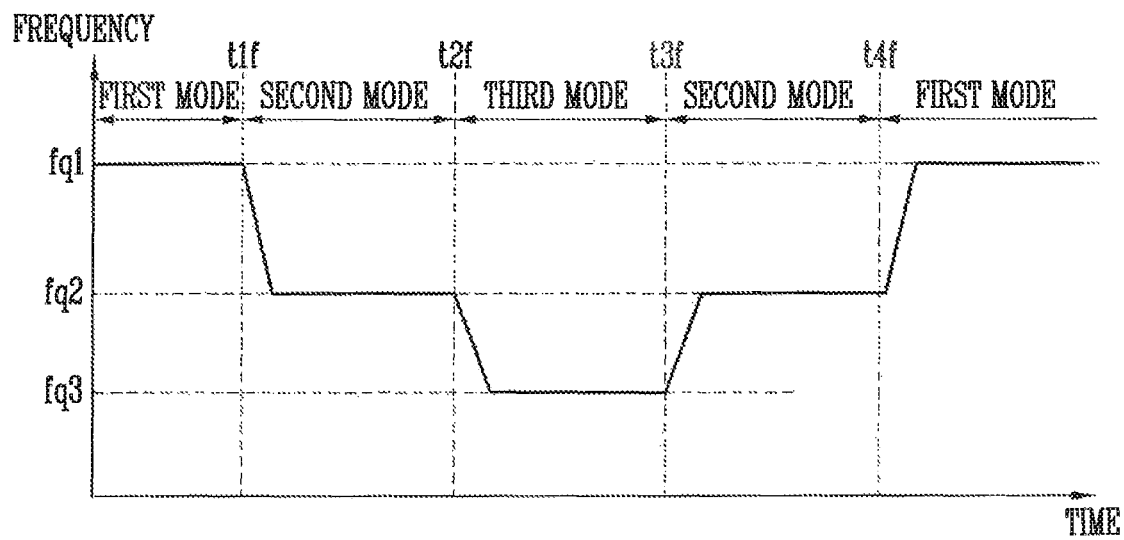
FIG. 13, FIG. 14 and FIG. 15 are drawings for explaining sensing frequencies set in respective modes according to embodiments of the present invention.
Figure 14:
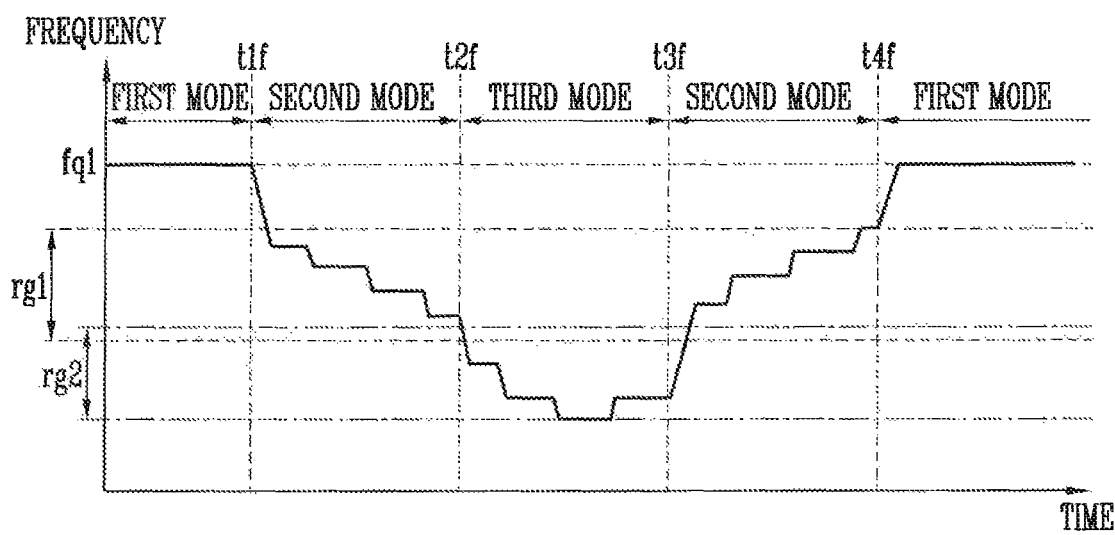
Figure 15:
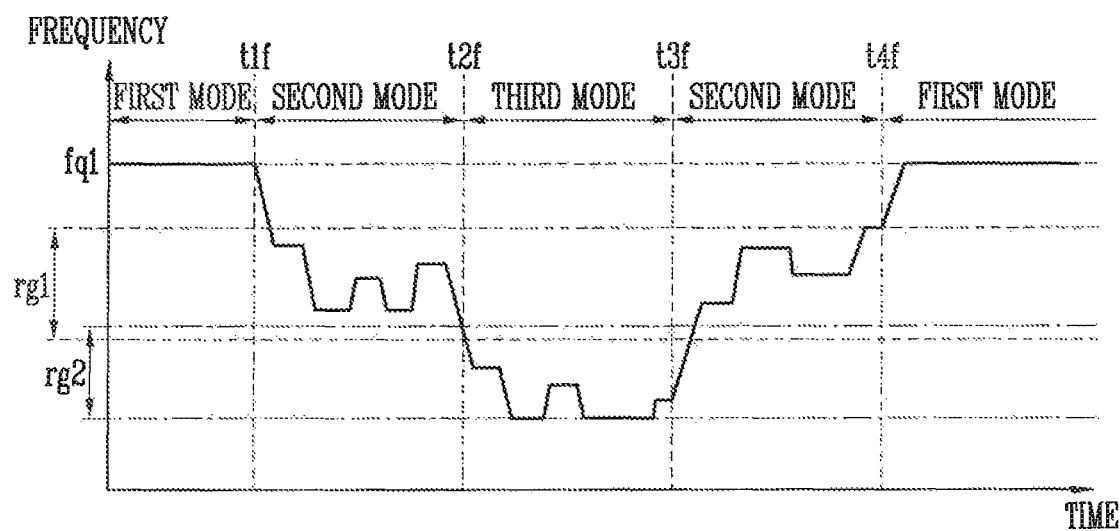

FIG. 13 to FIG. 15 are drawings for explaining sensing frequencies set in respective modes according to embodiments of the present invention.

Referring to FIG. 13 to FIG. 15, a frequency (for example, a sensing frequency) set in each mode is illustrated as an example.

Referring to FIG. 13, the sensor driver 220 may set a sensing frequency fq3 of the third mode to be lower than a sensing frequency fq2 of the second mode. Therefore, a sensing frame period in the third mode is longer than a sensing frame period in the second mode. Accordingly, the sensor driver 220 may use data based on sensing signals in each sensing frame period of the third mode more than in the second mode, and may further accurately detect the separation distance and the touch position between the sensor part 120 and the object OBJ. Accordingly, the releasing of the object OBJ in the third mode may be detected more quickly and accurately than the proximity of the object OBJ in the second mode.

In addition, the sensor driver 220 may set a sensing frequency fq1 of the first mode to be higher than the sensing frequency fq2 of the second mode in the first area PSA1. Accordingly, in the case of the proximity sensing in the second mode, the separation distance and the touch position between the sensor part 120 and the object OBJ may be more accurately detected by using the sensing frame period longer than that of the touch position sensing in the first mode.

In FIG. 13, the sensing frequency fq1 of the first mode may maintain a first level prior to time point t1f, the sensing frequency fq2 of the second mode may maintain a second level from the time point t1f to a time point t2f, and the sensing frequency fq3 of the third mode may maintain a third level from the time point t2f to a time point t3f.

Referring to FIG. 14, the sensor driver 220 may set the sensing frequency of the second mode to be gradually changed within a first range rg1 and the sensing frequency of the third mode to be gradually changed within a second range rg2. For example, the sensor driver 220 may set the sensing frequency of the second mode to be changed in a stepwise manner within the first range rg1 and the sensing frequency of the third mode to be changed in a stepwise manner within the second range rg2. In FIG. 14, the sensing frequency of the second mode may decrease from the time point t1f to the time point t2f, and the sensing frequency of the third mode may decrease from the time point t2f.

A lower limit frequency of the second range rg2 may be lower than that of the first range rg1. An upper limit frequency of the first range rg1 may be higher than that of the second range rg2. The upper limit frequency of the first range rg1 may be lower than the sensing frequency fq1 of the first mode. In some embodiments of the present invention, the first range rg1 and the second range rg2 may partially overlap. In another embodiment of the present invention, the first range rg1 and the second range rg2 may not overlap each other.

In addition, referring to FIG. 15, the sensor driver 220 may set the sensing frequency of the second mode to be irregularly changed within the first range rg1 and the sensing frequency of the third mode to be irregularly changed within the second range rg2. For example, the sensor driver 220 may set the sensing frequency of the second mode to repeatedly decrease and increase within the first range rg1 (for example, frequency hopping), and the sensing frequency of the third mode to repeatedly decrease and increase within the second range rg2.

According to the embodiment of FIG. 14 and FIG. 15, the sensor driver 220 may find an optimal sensing frequency for a current environment in each mode. For example, the sensor driver 220 may find the optimal sensing frequency by avoiding main noise frequencies of the current environment in each mode.

Figure 16:
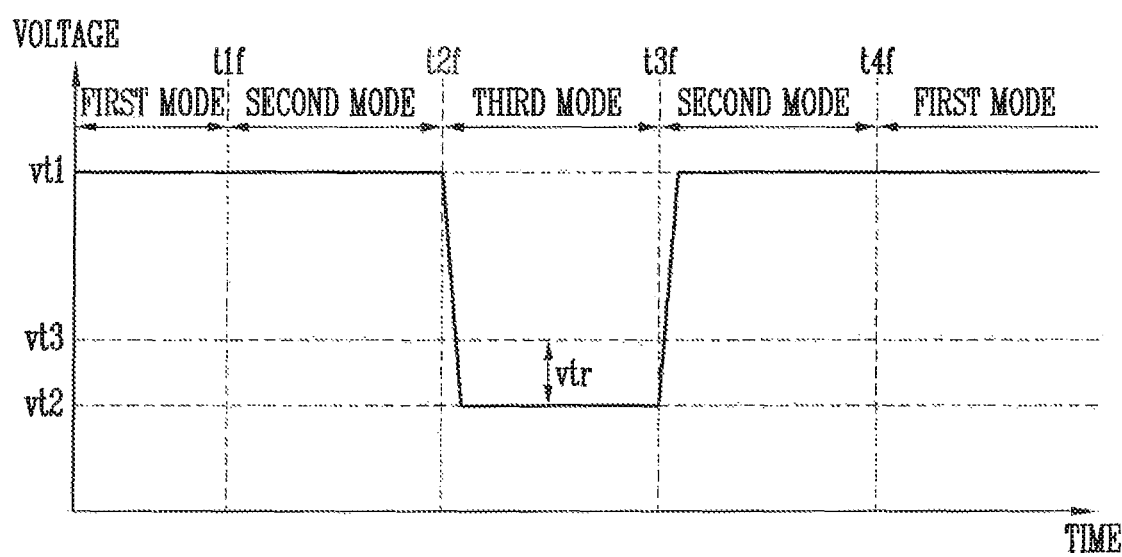
FIG. 16 is a drawing for explaining a voltage of a sensing signal set in each mode according to an embodiment of the present invention.

FIG. 16 is a drawing for explaining a voltage of a sensing signal set in each mode according to an embodiment of the present invention.

Referring to FIG. 16, the sensor driver 220 may set a voltage vt2 of the sensing signal of the third mode to be smaller than a voltage vt1 of the sensing signal of the second mode. In the present embodiment, the sensor driver 220 may set the voltage vt1 of the sensing signal of the first mode to be the same as the voltage vt1 of the sensing signal of the second mode.

In the present embodiment, the sensor driver 220 may set the voltage of the sensing signal of the third mode to be within a voltage range vtr smaller than the voltage vt1 of the sensing signal of the second mode. For example, the voltage range vtr may have an upper limit vt3 smaller than the voltage vt1 of the sensing signal of the second mode.

In the third mode, since the display device 1 is in a non-display state, display noise is very small, and thus power consumption may be reduced by reducing the voltage of the sensing signal of the third mode. In addition, when using another embodiment of the present inventions together, since the accuracy of the third mode is increased, it is possible to reduce the power consumption by reducing the voltage of the sensing signal of the third mode.

Figure 17:
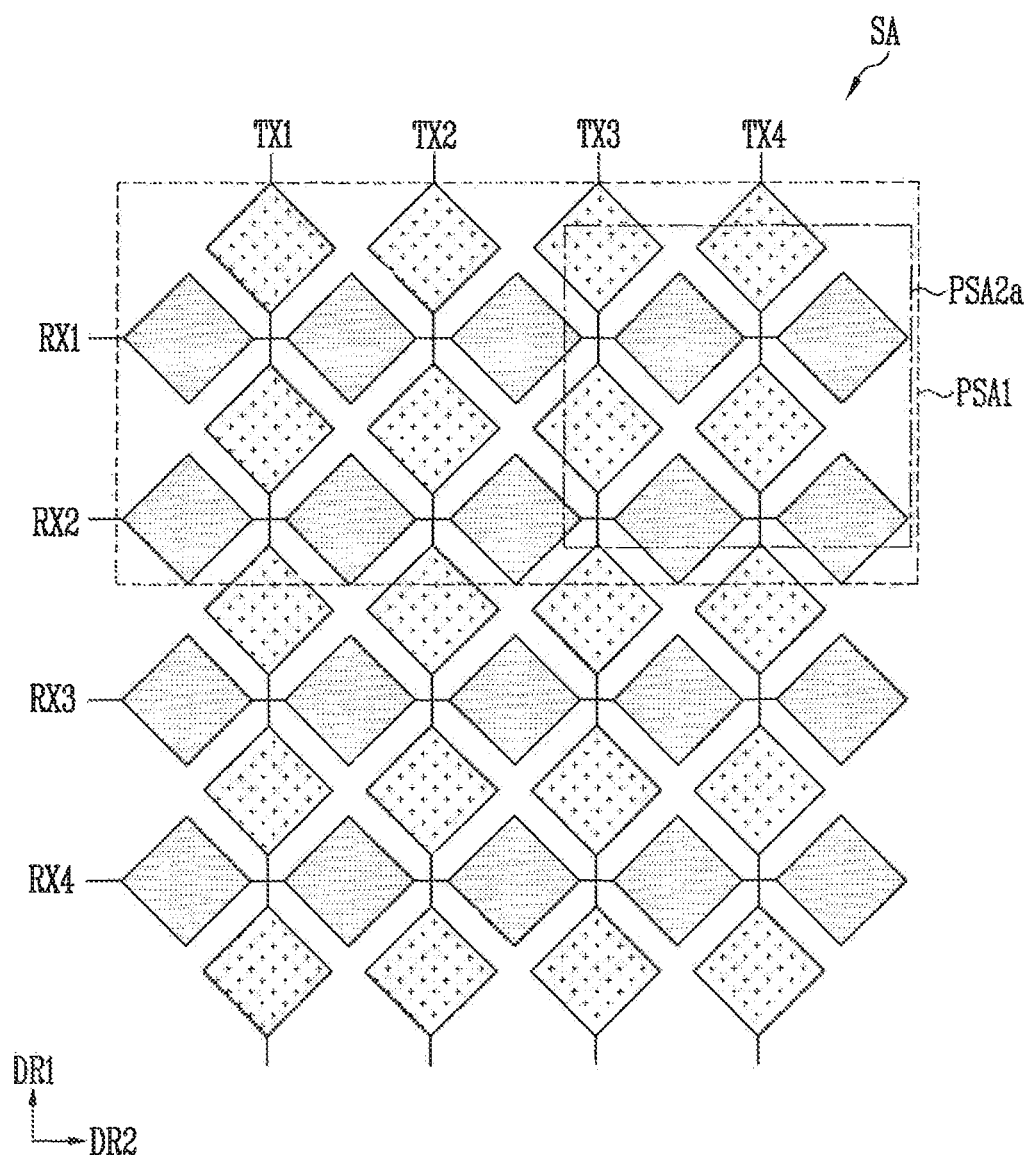
FIG. 17, FIG. 18 and FIG. 19 are drawings for explaining a difference between first areas set in a second mode and a third mode according to embodiments of the present invention.
Figure 18:
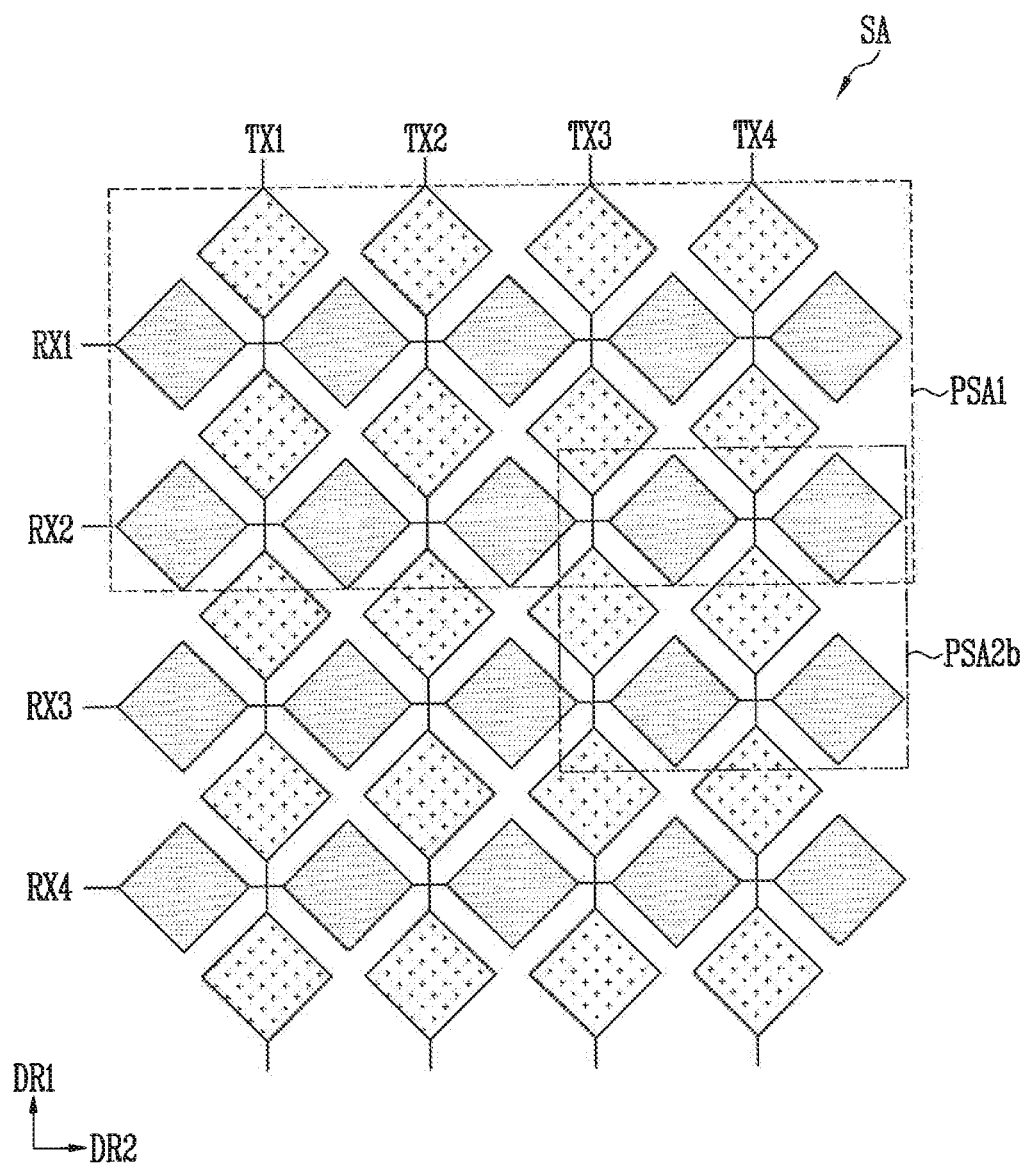
Figure 19:
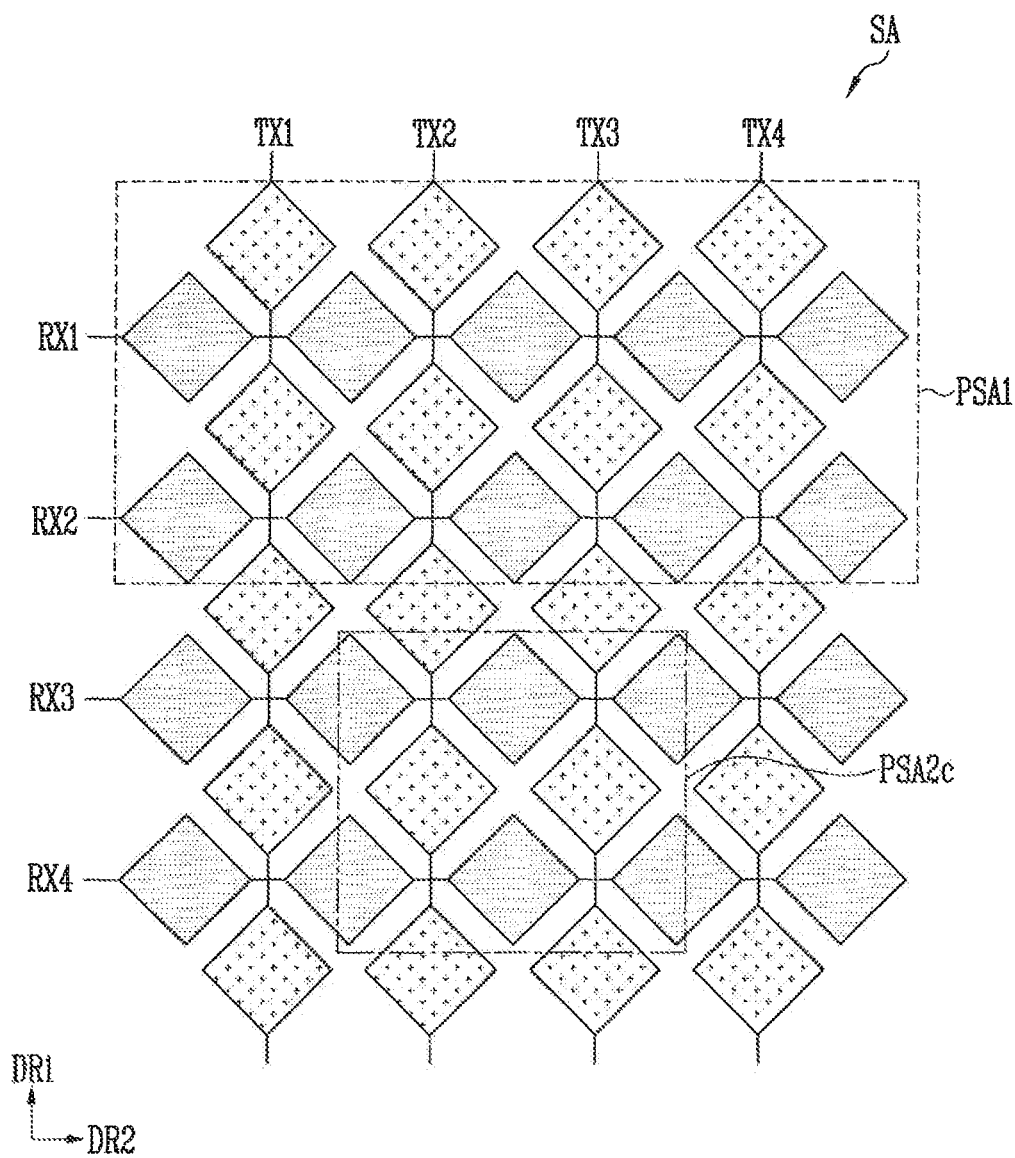

FIG. 17 to FIG. 19 are drawings for explaining a difference between first areas set in a second mode and a third mode according to embodiments of the present invention.

The sensor driver 220 may use the first area PSA1 as a proximity sensing area at an initial time point of the third mode. In this case, the first area PSA1 may be relatively large. This is because, since the object OBJ at the initial time point of the third mode is in a hovering state, it is unclear where the object OBJ will contact the sensor part 120.

Thereafter, the sensor driver 220 may change the first area PSA1 based on the position of the object OBJ during the third mode. When the position of the object OBJ is specified, referring to FIG. 17, the sensor driver 220 may reduce the first area PSA1 to set a new first area PSA2*a*. In other words, the sensor driver 220 may set the first area PSA2*a* of the third mode to be smaller than the first area PSA1 of the second mode. Here, the new first area PSA2*a* is located entirely within the prior first area PSA1.

In addition, the sensor driver 220 may set a first area PSA2*b* of the third mode to partially overlap the first area PSA1 of the second mode (see FIG. 18). Here, for example, the new first area PSA2*b* is partially located within the prior first area PSA1. In addition, the sensor driver 220 may set a first area PSA2*c* of the third mode to not overlap the first area PSA1 of the second mode (see FIG. 19). Here, for example, the new first area PSA2*c* may not be located within the prior first area PSA1.

According to the present embodiment, the sensor driver 220 may supply a sensing signal only to the sensors corresponding to the first areas PSA1, PSA2*a*, PSA2*b*, and PSA2*c* in the third mode. However, the sensor driver 220 needs to supply a sensing signal to the sensors corresponding to the outside of the first areas PSA1, PSA2*a*, PSA2*b*, and PSA2*c* in the second mode. This is because, in the second mode, touch position sensing must also be performed.

According to the present embodiment, in the third mode, since there is no need to supply a sensing signal to unnecessary first sensors TX, power consumption may be reduced. For example, in the case of FIG. 17 and FIG. 18, it is not necessary to supply sensing signals to the first sensors TX1 and TX2. In addition, in the case of FIG. 19, it is not necessary to supply sensing signals to the first sensors TX1 and TX4.

In the present embodiment, by setting to not receive a sampling signal from unnecessary second sensors RX in the third mode, it is possible to further reduce power consumption. For example, in the case of FIG. 17, no sampling signal may be received from the second sensors RX3 and RX4, and in the case of FIG. 18, no sampling signal may be received from the second sensors RX1 and RX4, and in the case of FIG. 19, no sampling signal may be received from the second sensors RX1 and RX2.

According to an embodiment of the present invention, the display device 1 includes: a pixel part 14 including pixels PX; a sensor part 120 overlapping the pixel part 14 and including sensors SC; and a sensor driver 220 that transmits a sensing signal to p sensors in a first area of the sensor part in a first mode (PSA1 of FIG. 10), transmits the sensing signal to q sensors in the first area in a second mode (PSA1 of FIG. 17), and transmits the sensing signal to r sensors in the first area in a third mode (PSA2*a* of FIG. 17), wherein p is an integer greater than 0, and q and r are integers greater than p. In addition, the sensor driver 220 sets a sensing frequency (fq2, fq3), the first area, the number of sensing times per sensing frame period, whether or not the sensor driver is synchronized with a timing signal of the pixel part, or a voltage level (vt1, vt2, vt3) of the sensing signal, to be different in the second mode and the third mode.

Figure 20:
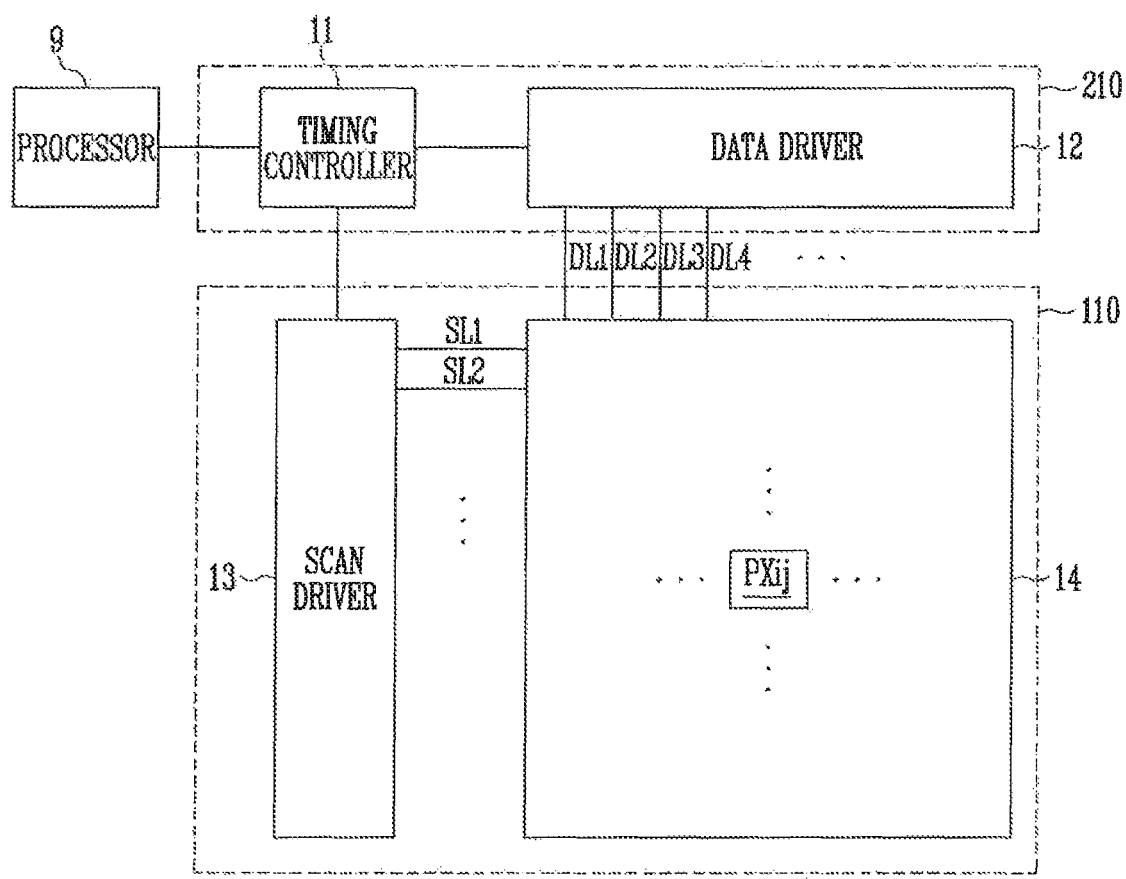
FIG. 20 is a drawing for explaining a display part and a display driver according to an embodiment of the present invention.

FIG. 20 is a drawing for explaining a display part and a display driver according to an embodiment of the present invention.

Referring to FIG. 20, the display driver 210 may include the data driver 12 and the timing controller 11, and the display part 110 may include the scan driver 13 and the pixel part 14. However, as described above, whether respective functional parts are to be integrated into one IC or into a plurality of ICs, or to be mounted on the display substrate 111 may be variously configured according to specifications of the display device 1.

The timing controller 11 may receive grays and timing signals for each display frame period from a processor 9. Here, the processor 9 may correspond to at least one of a graphics processing unit (GPU), a central processing unit (CPU), and an application processor (AP). The timing signals may include a vertical synchronization signal, a horizontal synchronization signal, a data enable signal, and the like.

Each cycle of the vertical synchronization signal may correspond to each display frame period. Each cycle of the horizontal synchronization signal (e.g., Hsync) may correspond to each horizontal period. The grays may be supplied in units of a horizontal line in each horizontal period in response to a pulse of an enable level of the data enable signal. The horizontal line may mean pixels connected to the same scan line (for example, a pixel row).

The timing controller 11 may render grays to correspond to the specifications of the display device 1. For example, the processor 9 may provide a red gray, a green gray, and a blue gray for each unit dot. For example, when the pixel part 14 has an RGB stripe structure, a pixel may correspond to each gray one to one. In this case, rendering of grays may not be necessary. However, for example, when the pixel part 14 has a PENTILE™ structure, since adjacent unit dots share a pixel, the pixel may not correspond to each gray one to one. In this case, rendering of grays may be necessary. Rendered or non-rendered grays may be provided to the data driver 12. In addition, the timing controller 11 may provide a data control signal to the data driver 12. Further, the timing controller 11 may provide a scan control signal to the scan driver 13.

The data driver 12 may generate data voltages to be provided to data lines DL1, DL2, DL3, and DL4 by using the grays and the data control signals received from the timing controller 11.

The scan driver 13 may use a clock signal, a scan start signal, and the like received from the timing controller 11 to generate scan signals to be provided to scan lines SL1 and SL2. The scan driver 13 may sequentially supply scan signals having a turn-on level pulse to the scan lines SL1 and SL2. For example, the scan driver 13 may supply the scan signals of a turn-on level to the scan lines SL1 and SL2 at a cycle corresponding to a cycle of the horizontal synchronization signal during an active period in which grays are supplied. The scan driver 13 may include scan stages configured in a form of a shift register. The scan driver 13 may generate the scan signals through a method of sequentially transmitting a scan start signal, which is a pulse type of a turn-on level, to a next scan stage according to control of the clock signal.

The pixel part 14 includes pixels. Respective pixels may be connected to a corresponding data line and scan line. For example, a pixel PXij may be connected to an i-th scan line and a j-th data line. The pixels may include pixels that emit first color light, pixels that emit second color light, and pixels that emit third color light. The first color, the second color, and the third color may be different colors. For example, the first color may be one color of red, green, and blue, the second color may be one color of red, green, and blue excluding the first color, and the third color may be the remaining color of red, green, blue excluding the first and second colors. In addition, magenta, cyan, and yellow may be used instead of red, green, and blue as the first to third colors.

Figure 21:
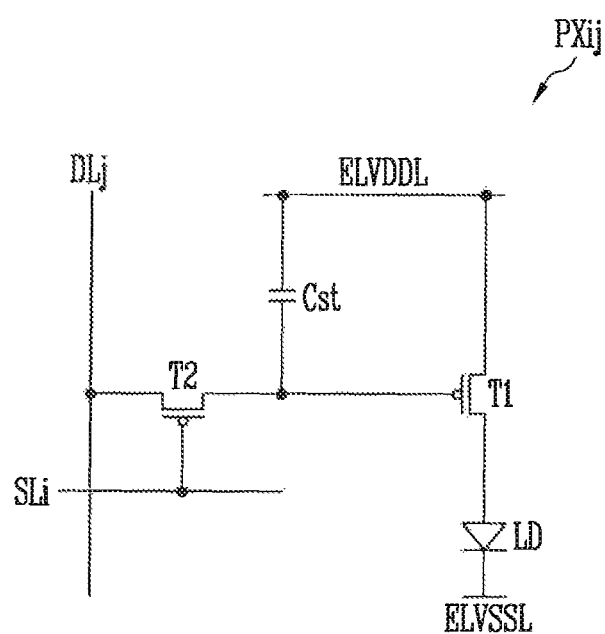
FIG. 21 is a drawing for explaining a pixel according to an embodiment of the present invention.

FIG. 21 is a drawing for explaining a pixel according to an embodiment of the present invention.

Referring to FIG. 21, the pixel PXij is shown. Since other pixels may also have a substantially equivalent configuration, duplicate descriptions will be omitted.

A gate electrode of a transistor T1 may be connected to a second electrode of a storage capacitor Cst, a first electrode of the transistor T1 may be connected to a first power line ELVDDL, and a second electrode of the transistor T1 may be connected to an anode of a light emitting element LD. The transistor T1 may be referred to as a driving transistor.

A gate electrode of a transistor T2 may be connected to an i-th scan line SLi, a first electrode of the transistor T2 may be connected to a j-th data line DLj, and a second electrode of the transistor T2 may be connected to the second electrode of the storage capacitor Cst. The transistor T2 may be referred to as a scan transistor.

A first electrode of the storage capacitor Cst may be connected to the first power line ELVDDL, and the second electrode of the storage capacitor Cst may be connected to the gate electrode of the transistor T1.

The anode of the light emitting element LD may be connected to the second electrode of the transistor T1, and a cathode of the light emitting element LD may be connected to a second power line ELVSSL. The light emitting element LD may be a light emitting diode. As described above, the light emitting element of each pixel may be an organic light emitting element, an inorganic light emitting element, or a quantum dot/well light emitting element. In addition, each pixel may be provided with a plurality of light emitting elements. In this case, the plurality of light emitting elements may be connected in series, in parallel, or in series/parallel. During a light emitting period of the light emitting element LD, a first power voltage applied to the first power line ELVDDL may be greater than a second power voltage applied to the second power line ELVSSL.

Here, the transistors T1 and T2 are illustrated as P-type transistors, but at least one of the transistors may be replaced with an N-type transistor by inverting a polarity of a signal.

When a scan signal of a turn-on level is applied to the i-th scan line SLi, the transistor T2 may be turned on. In this case, a data voltage charged in the j-th data line DLj may be stored in the storage capacitor Cst. The transistor T1 may allow a driving current to flow in response to a gate-source voltage difference maintained by the storage capacitor Cst. The driving current may flow through a path of the first power line ELVDDL, the transistor T1, the light emitting element LD, and the second power line ELVSSL. The light emitting element LD may emit light with a luminance corresponding to an amount of the driving current.

Figure 22:
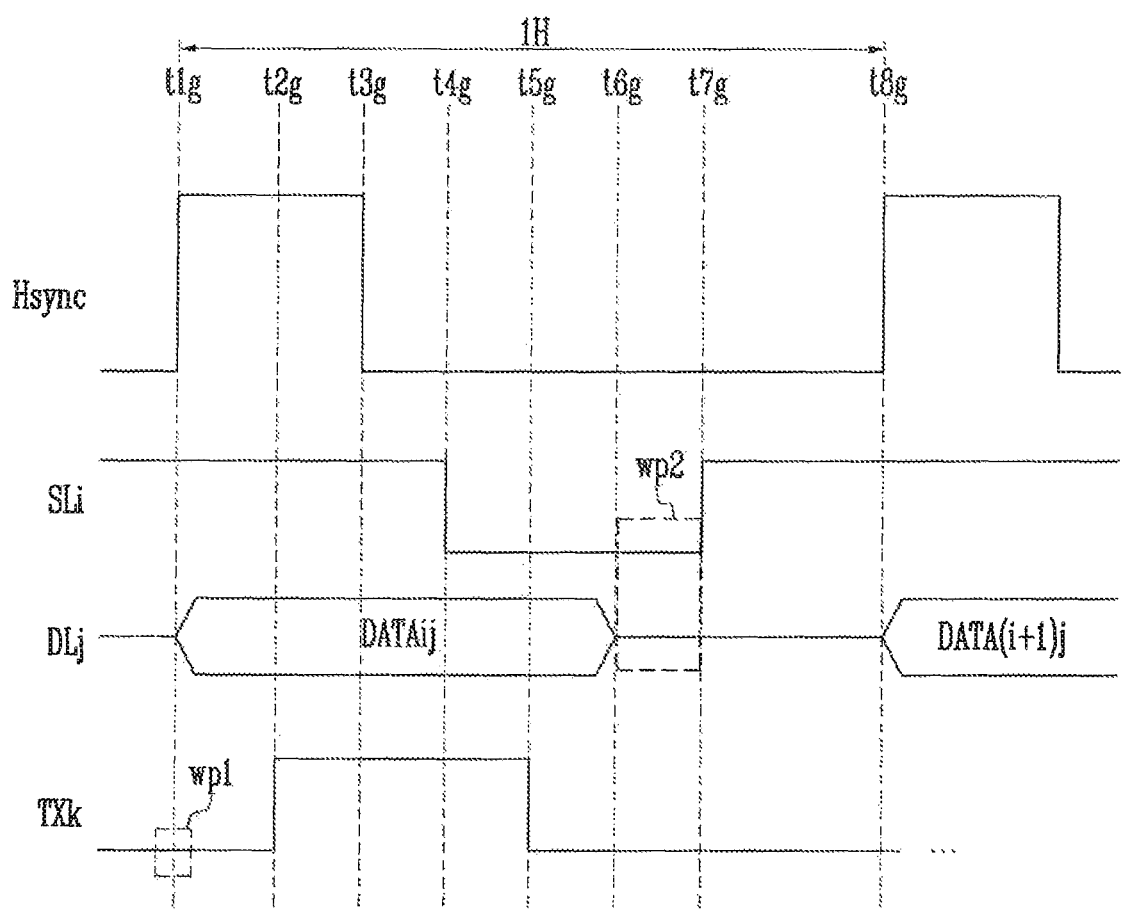
FIG. 22, FIG. 23 and FIG. 24 are drawings for explaining whether timing signals of a sensor driver and a pixel part are synchronized according to embodiments of the present invention.
Figure 23:
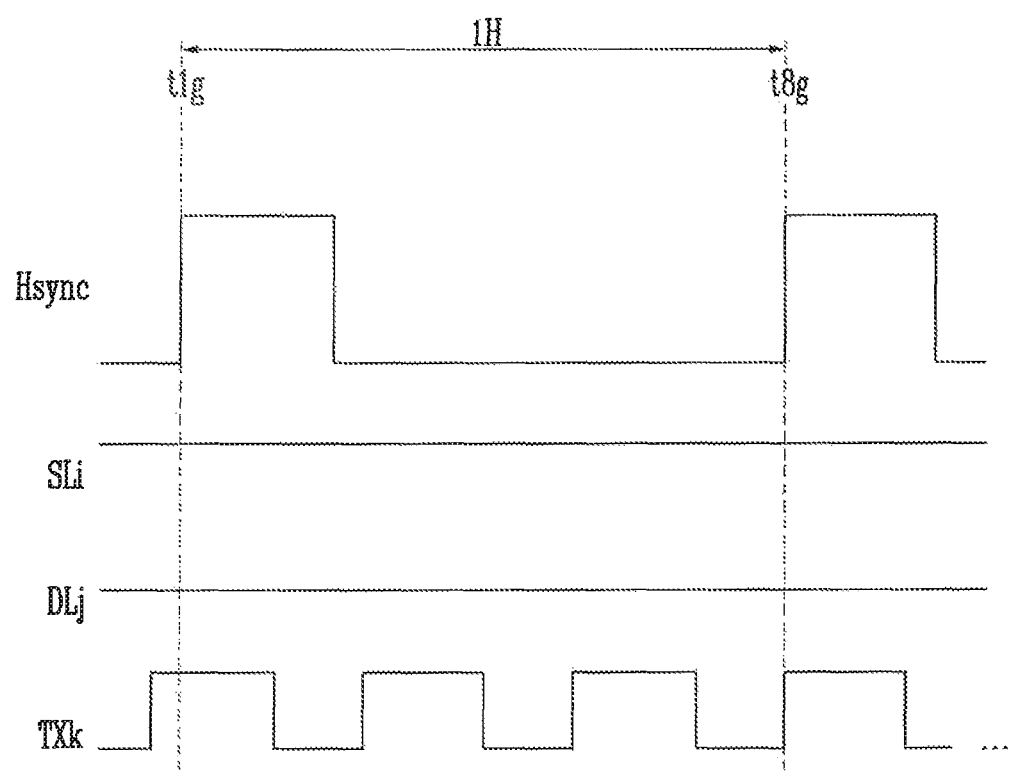
Figure 24:
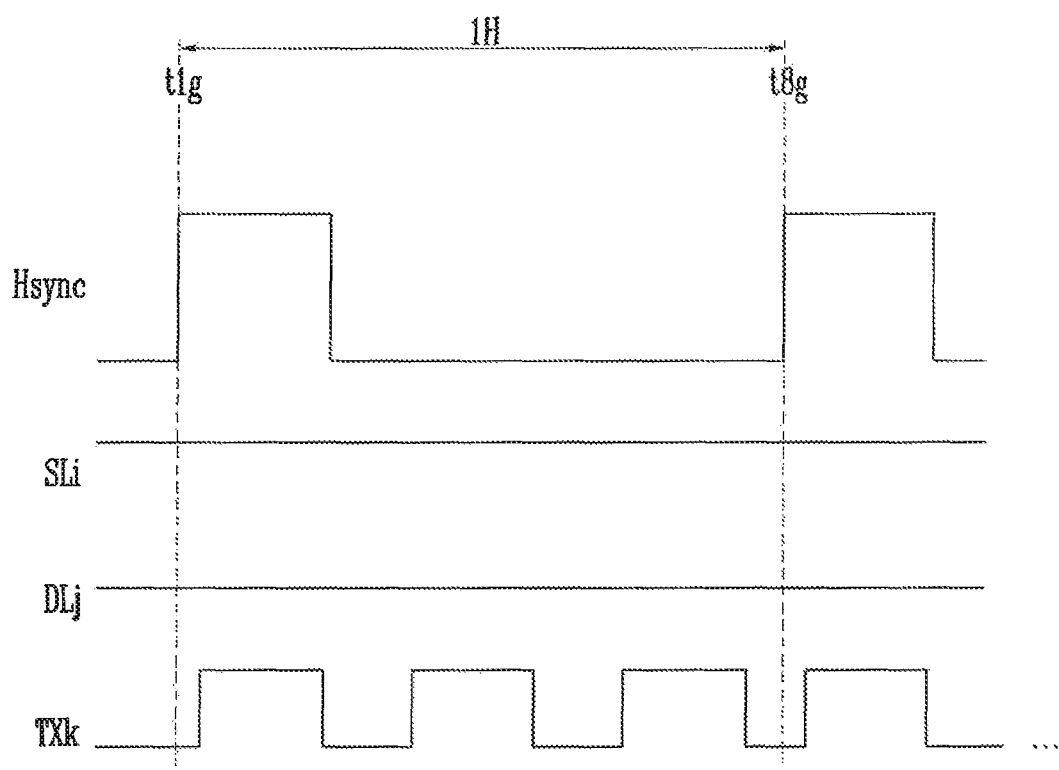

FIG. 22 to FIG. 24 are drawings for explaining whether timing signals of a sensor driver and a pixel part are synchronized according to embodiments of the present invention.

Referring to FIG. 22, the signals of the i-th scan line SLi and the j-th data line DLj connected to the pixel PXij are shown. In addition, a signal of a k-th first sensor TXk is illustrated as an example. A horizontal period 1H may include a data writing period (in other words, a data voltage storing period) of the pixels (i-th pixel row) connected to the i-th scan line SLi.

As described above, the processor 9 may provide the timing signals such as the horizontal synchronization signal Hsync to the timing controller 11 or the display driver 210.

In the embodiment of FIG. 22, the sensor driver 220 may be configured to receive at least some of the timing signals. The sensor driver 220 may receive the timing signals directly from the processor 9, or may receive the timing signals from the timing controller 11 (or the display driver 210). For example, the sensor driver 220 may receive the horizontal synchronization signal Hsync.

The horizontal period 1H be from a time point t1g when the horizontal synchronization signal Hsync is changed from a first logic level (for example, low logic level) to a second logic level (for example, high logic level) up to a next time point t8g when the horizontal synchronization signal Hsync is changed from the first logic level to the second logic level.

The data driver 12 (or the display driver 210) may start to output data voltages (DATAij, . . . ) for at least some of the pixels PX (for example, the i-th pixel row) at the time point t1g during the horizontal period 1H, and may end the outputting of the data voltages (DATAij, . . . ) at a time t6g of the horizontal period 1H. For example, the data driver 12 may output the data voltage DATAij to the j-th data line DLj during the periods t1g to t6g.

The sensor driver 220 (or the sensor transmitter TDC) may transmit a sensing signal (for example, a rising transition signal) to at least some of the sensors TXk at the time point t2g different from the time points t1g and t6g during the horizontal period 1H. For example, the sensor driver 220 may supply a sensing signal (for example, a falling transition signal) to the k-th first sensor TXk at the time point t5g. The sensing signal may be supplied while the data voltage DATAij is output.

The time point t1g at which the data voltage DATAij is changed may correspond to a sensor weak period wp1. Unintentional parasitic capacitance may exist between the sensor TXk and the pixel PXij, and the change in the data voltage DATAij at the time point t1g may act on the sensor unit 120 as sensing noise. Therefore, it the sensor driver 220 should avoid the sensor weak period wp1 for sensing.

In addition, the period from t6g to t7g in which the scan transistor T2 is turned on while the data line DLj is floating due to the termination of the supply of the data voltage DATAij may correspond to a display weak period wp2. When the sensing signal is supplied during the display weak period wp2, an incorrect data voltage may be written to the pixel PXij. Therefore, the sensor driver 220 should avoid the sensor weak period wp2 for sensing.

According to the present embodiment, the scan driver 13 may output a scan signal of a turn-on level for at least some of the pixels PXij from the time point t4g to the time point t7g during the horizontal period 1H. In this case, from the time point t6g to the time point t7g, the sensing signal may not be supplied.

In other words, in the second mode in which the pixel part 14 is in the display state, the sensor driver 220 needs to supply the sensing signal while avoiding the sensor weak period wp1 and the display weak period wp2. Therefore, in the second mode, the sensor driver 220 should be synchronized with the horizontal synchronization signal Hsync.

On the other hand, in the third mode in which the pixel part 14 is in the non-display state, the sensor driver 220 may be asynchronous with the horizontal synchronization signal Hsync (see FIG. 23). This is because the sensor weak period wp1 and the display weak period wp2 do not exist in the third mode. In this case, the sensor driver 220 may not receive the timing signals such as the horizontal synchronization signal Hsync. When the sensor driver 220 is not synchronized with the horizontal synchronization signal Hsync, the sensing signals may be freely supplied, so that the frequency of supplying the sensing signals may increase. For example, the sensor driver 220 may set the number of sensing times per sensing frame period of the third mode to be greater than the number of sensing times per sensing frame period of the second mode. On the other hand, referring to the sensing frequency of FIG. 13, since the sensing frame period of the first mode is shorter than that of the second mode, the sensor driver 220 may set the number of sensing times per sensing frame period of the first mode to be smaller than the number of sensing times per sensing frame period of the second mode.

In some embodiments of the present invention, even in the third mode, the sensor driver 220 may be synchronized with the horizontal synchronization signal Hsync (see FIG. 24). Even in this case, since the sensor weak period wp1 and the display weak period wp2 do not exist, the sensing signals may be freely supplied and the frequency of supplying the sensing signal may be increased, compared with the first mode and the second mode. However, the frequency of supplying the sensing signal in the case of FIG. 24 may be lower than that of FIG. 23 which is asynchronous.

The sensor driver 220 may be asynchronous with the horizontal synchronization signal Hsync in the first mode. In another embodiment of the present invention, the sensor driver 220 may be synchronized with the horizontal synchronization signal Hsync in the first mode.

FIG. 25 to FIG. 31 are drawings for explaining an example configuration of a display device. Reference numerals of FIG. 25 to FIG. 31 and the reference numerals of FIG. 1 to FIG. 24 are independent of each other.

Figure 25:
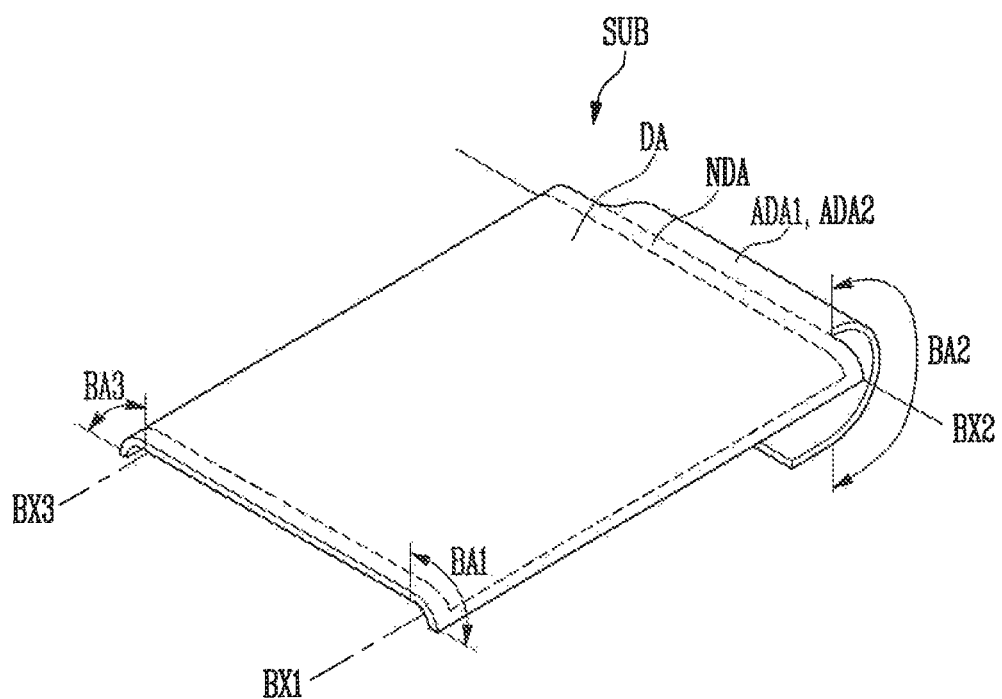
FIG. 25, FIG. 26, FIG. 27, FIG. 28, FIG. 29, FIG. 30 and FIG. 31 are drawings for explaining an example configuration of a display device.
Figure 26:
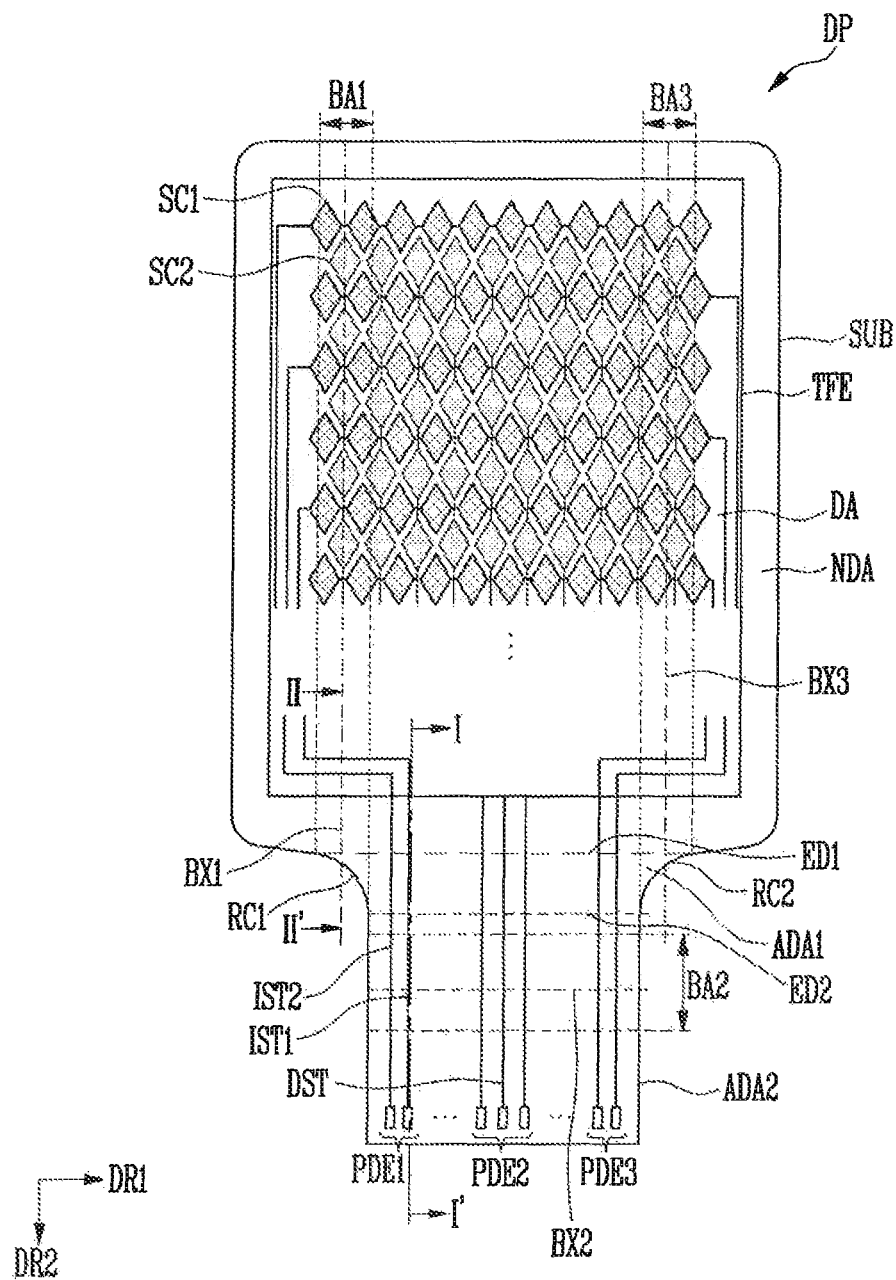

FIG. 25 is a drawing for explaining a substrate according to an embodiment of the present invention, and FIG. 26 is a drawing for explaining a display device according to an embodiment of the present invention.

In the following embodiments, a position of a plane may be defined by the first direction DR1 and the second direction DR2, and a position of a height may by defined by the third direction DR3 (see FIG. 27). The first direction DR1, the second direction DR2, and the third direction DR3 may be directions orthogonal to each other.

A substrate SUB may include a display area DA, a non-display area NDA, a first additional area ADA1, and a second additional area ADA2.

The display area DA may have a rectangular shape. Each corner of the display area DA may have an angled shape or a curved shape. In addition, in a case of a circular display, the display area DA may have a circular shape. In addition, the display area DA may have a polygonal shape other than a quadrangular shape and an elliptical shape. As such, the shape of the display area DA may be differently set depending on a product.

Pixels may be disposed on the display area DA. Depending on a type of the display device DP, respective pixels may include a light emitting diode or a liquid crystal layer.

The non-display area NDA may surround a periphery of the display area DA. For example, the non-display area NDA may have a rectangular shape. Each corner of the non-display area NDA may have an angled shape or a curved shape. FIG. 26 illustrates a case in which each corner of the non-display area NDA has a curved shape. The non-display area NDA may have a circular shape. Since the non-display area NDA may be minimized to have a narrow bezel structure, a shape of the non-display area NDA may be similar to that of the display area DA.

The first additional area ADA1 may be disposed between the non-display area NDA and the second additional area ADA2. The first additional area ADA1 may be connected to the non-display area NDA at a first boundary ED1. The first additional area ADA1 may be connected to the second additional area ADA2 at a second boundary ED2. The first boundary ED1 and the second boundary ED2 may extend in the first direction DR1, respectively.

A width of the first additional area ADA1 may become narrower from the first boundary ED1 to the second boundary ED2. In other words, the width of the first additional area ADA1 in the first direction DR1 may become narrower toward the second direction DR2. Accordingly, the first additional area ADA1 may include curved first and second lateral surfaces RC1 and RC2. The first and second lateral surfaces RC1 and RC2 may be convex toward the inside of the substrate SUB (for example, a center of the substrate SUB).

In FIG. 26, the first additional area ADA1 is illustrated to include the two first and second lateral surfaces RC1 and RC2 in the first direction DR1 and an opposite direction thereof. In another embodiment of the present invention, the first additional area ADA1 may include only the first lateral surface RC1 because the boundary positioned in the first direction DR1 coincides with the boundary of the non-display area NDA. In another embodiment of the present invention, the first additional area ADA1 may include only the second lateral surface RC2 because the boundary positioned in the opposite direction of the first direction DR1 coincides with the boundary of the non-display area NDA.

The second additional area ADA2 may have a rectangular shape. Each corner positioned in the second direction DR2 of the second additional area ADA2 may have an angled shape or a curved shape. FIG. 26 illustrates a case in which each corner positioned in the second direction DR2 of the second additional area ADA2 has an angled shape.

An encapsulation film TFE may be disposed on the pixels. For example, the encapsulation film TFE may cover the pixels in the display area DA, and a boundary of the encapsulation film TFE may be disposed in the non-display area NDA. The encapsulation film TFE covers the light emitting elements and the circuit elements of the pixels of the display area DA, thereby preventing damage from external moisture or impact.

Sensing electrodes SC1 and SC2 may be disposed on the encapsulation film TFE. The sensing electrodes SC1 and SC2 may detect a touch, hovering, gesture, proximity, or the like by the user's body. The sensing electrodes SC1 and SC2 have different shapes according to various types such as a resistive type, a capacitive type, an electromagnetic (EM) type, and an optical type. For example, when the sensing electrodes SC1 and SC2 are configured in a capacitive type, the sensing electrodes SC1 and SC2 may be configured in a self-capacitive type or a mutual-capacitive type. Hereinafter, for better understanding and ease of description, a case in which the sensing electrodes SC1 and SC2 are configured in a mutual-capacitance type will be described as an example.

When the sensing electrodes SC1 and SC2 are configured in a mutual capacitance type, a driving signal is transmitted through a sensing wire corresponding to the first sensing electrode SC1, and a sensing signal may be received through a sensing wire corresponding to the second sensing electrode SC2 forming a mutual capacitance with the first sensing electrode SC1. When the user's body approaches, the mutual capacitance between the first sensing electrode SC1 and the second sensing electrode SC2 may be changed, and depending on a difference between the sensing signals, whether there is the user's touch may be detected. In another embodiment of the present invention, a driving signal is transmitted through a sensing wire corresponding to the second sensing electrode SC2, and a sensing signal may be received through a sensing wire corresponding to the first sensing electrode SC1 forming a mutual capacitance with the second sensing electrode SC2.

Pads PDE1, PDE2, and PDE3 may be disposed on the second additional area ADA2. The pads PDE1 and PDE3 may be connected to the sensing electrodes SC1 and SC2 disposed on the encapsulation film through sensing wires IST1 and IST2. The pads PDE1 and PDE3 may be connected to an external touch integrated chip (IC). In addition, the pads PDE2 may be connected to pixels or a driver of the pixels disposed under the encapsulation film TFE through display wires DST. The pads PDE2 may be positioned between the pads PDE1 and PDE3. The driver may include a scan driver, a light emission driver, a data driver, and the like. The driver may be disposed under the encapsulation film TFE, or may be disposed on an external display IC connected to through the pads PDE2.

When the display device DP is a mutual capacitance type, the touch IC may transmit a driving signal through the first sensing wire IST1, and may receive a sensing signal through the second sensing wire IST2. In another embodiment of the present invention, the driving signal may be transmitted through the second sensing wire IST2, and the sensing signal may be received through the first sensing wire IST1. For reference, when the display device DP is a self-capacitance type, there may be no difference in driving methods of the first sensing wire IST1 and the second sensing wire IST2. The display wires DST may include a control line, a data line, a power line, etc., and may provide signals so that the pixels may display an image. These signals may be provided from a driver connected to the display wires DL.

FIG. 25 illustrates a state in which the substrate SUB is bent, and FIG. 26 illustrates a state in which the substrate SUB is not bent. The display device DP may be bent as shown in FIG. 25 after elements are stacked on the substrate SUB in a state that is not bent as shown in FIG. 26.

The substrate SUB may include a first bending area BA1 extending from the first lateral surface RC1 of the first additional area ADA1 to overlap the non-display area NDA. Additionally, the first bending area BA1 may extend to overlap the display area DA. In other words, each of the display area DA, the non-display area NDA, and the first additional area ADA1 may partially overlap the first bending area BA1. The first bending area BA1 may have a width in the first direction DR1, and may extend lengthwise in the second direction DR2. A first bending axis BX1 may be referred to as a folding line extending from a center of the first bending area BA1 in the second direction DR2. In some embodiments of the present invention, the first bending area BA1 may be a portion of the display device DP in which a stress is reduced by removing a portion of an insulating film thereof, unlike other portions in the vicinity thereof. In some embodiments of the present invention, the first bending area BA1 may have the same configuration as other portions around it.

The substrate SUB may include a third bending area BA3 extending from the second lateral surface RC2 of the first additional area ADA1 to overlap the non-display area NDA. Additionally, the second bending area BA3 may extend to overlap the display area DA. In other words, each of the display area DA, the non-display area NDA, and the first additional area ADA1 may partially overlap the third bending area BA3. The third bending area BA3 may have a width in the first direction DR1, and may extend lengthwise in the second direction DR2. A third bending axis BX3 may be referred to as a folding line extending from a center of the third bending area BA3 in the second direction DR2. In some embodiments of the present invention, the third bending area BA3 may be a portion of the display device DP in which a stress is reduced by removing a portion of an insulating film thereof, unlike other portions in the vicinity thereof. In some embodiments of the present invention, the third bending area BA3 may have the same configuration as other portions around it.

The second additional area ADA2 may include a second bending area BA2. The second bending area BA2 may have a width in the second direction DR2, and may extend lengthwise in the first direction DR2. A second bending axis BX2 may be referred to as a folding line extending from a center of the second bending area BA2 in the first direction DR1. In some embodiments of the present invention, the second bending area BA2 may be a portion of the display device DP in which a stress is reduced by removing a portion of an insulating film thereof, unlike other portions in the vicinity thereof. In some embodiments of the present invention, the second bending area BA2 may have the same configuration as other portions around it.

The first to third bending areas BA1, BA2, and BA3 may not overlap each other.

Herein, the term "folded" may mean that a shape is not fixed, but an original shape may be changed to another shape, and the shape is folded, curved, or rolled along one or more bending axes. By the first and third bending areas BA1 and BA3, the side bezel width of the opposite direction of the first direction DR1 of the display device DP and a width of the side bezel of the first direction DR1 may be reduced. In addition, a width of the side bezel of the second direction DR2 of the display device DP may be reduced by the second bending area BA2.

Figure 27:
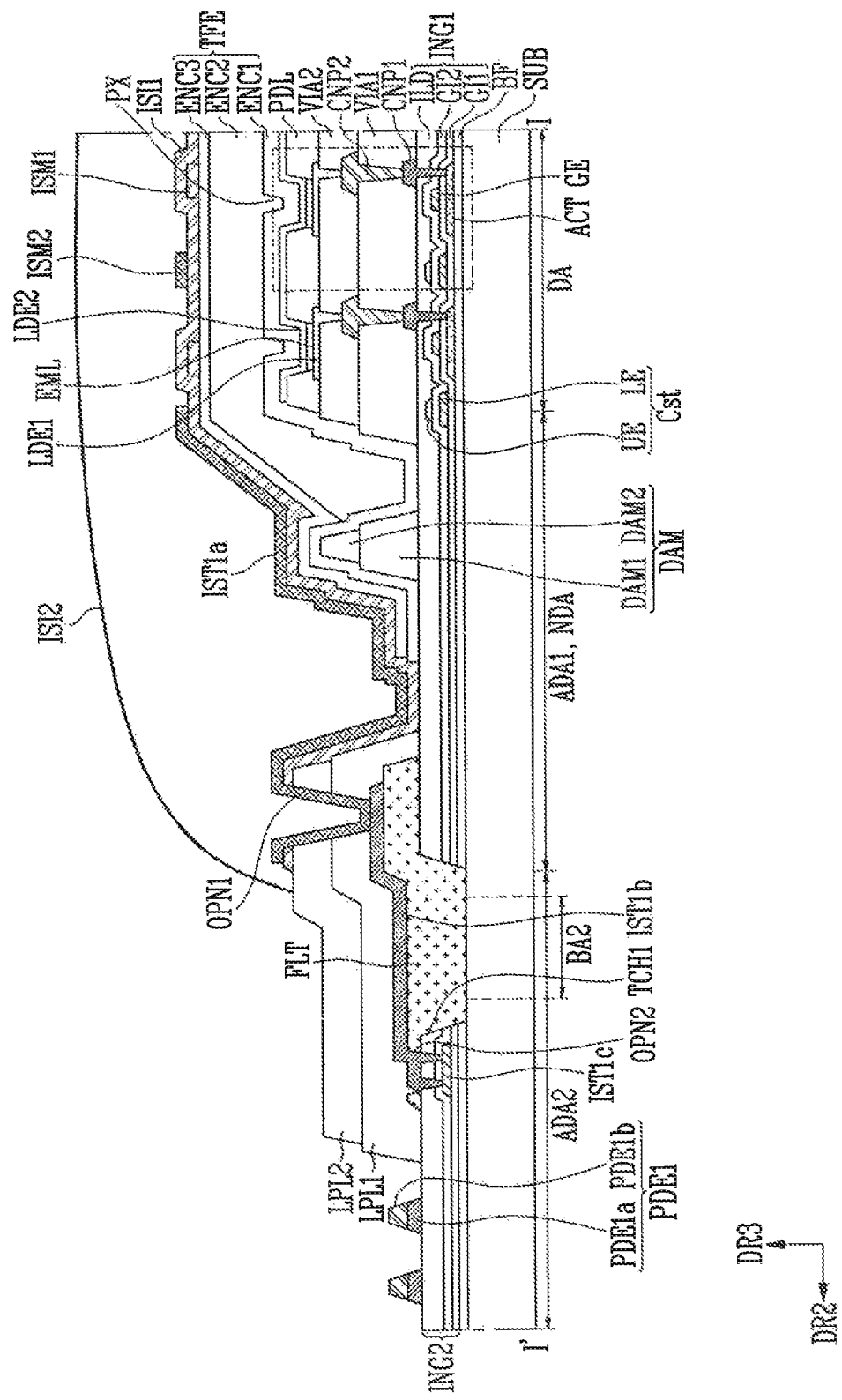

FIG. 27 is a cross-sectional view taken along line I-I' of FIG. 26. It is assumed that line I-I' in FIG. 26 passes through the first pad PDE1 and the first sensing wire IST1.

First, the display area DA will be described. In the present embodiment, the pixels PX are provided in the display area DA. Each pixel PX may include a transistor connected to a corresponding wire among the display wires DST, a light emitting element connected to the transistor, and a capacitor Cst. In FIG. 27, for better understanding and ease of description, one transistor, one light emitting element, and one capacitor Cst are illustrated for one pixel PX.

The substrate SUB may be made of an insulating material such as glass or a resin. In addition, the substrate SUB may be made of a flexible material to be bendable or foldable, and may have a single-layered structure or a multi-layered structure.

For example, the substrate SUB may include at least at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material included in the substrate SUB may be variously changed, and may also include fiber reinforced plastic (FRP).

For example, when the substrate SUB has a multi-layered structure, inorganic materials such as a silicon nitride, a silicon oxide, and a silicon oxynitride may be interposed between a plurality of layers in a single layer or in a plurality of layers.

A buffer film BF may cover the substrate SUB. The buffer film BF may prevent impurities from diffusing into a channel of the transistor. The buffer film BF may be an inorganic insulating film made of an inorganic material. For example, the buffer film BF may be made of a silicon nitride, a silicon oxide, a silicon oxynitride, or the like, and may be omitted depending on the materials and the process conditions of the substrate SUB. In some embodiments of the present invention, a barrier layer may be further provided.

An active film ACT may be disposed on the buffer film BF. The active film ACT may be patterned to form a channel, a source electrode, and a drain electrode of a transistor, or to form a wire. The active film ACT may be made of a semiconductor material. The active film ACT may be a semiconductor pattern made of polysilicon, amorphous silicon, or an oxide semiconductor. The channel of the transistor is a semiconductor pattern that is not doped with an impurity, and may be an intrinsic semiconductor. The source electrode, the drain electrode, and the wire may be a semiconductor pattern doped with an impurity. An N-type impurity, a P-type impurity, and other impurities such as metal may be used as the impurity.

A first gate insulating film GI1 may cover the active film ACT. The first gate insulating film GI1 may be an inorganic insulating film made of an inorganic material. As the inorganic material, an inorganic insulating material such as polysiloxane, a silicon nitride, a silicon oxide, or a silicon oxynitride may be used.

A gate electrode GE of the transistor and a lower electrode LE of the capacitor Cst may be disposed on the first gate insulating layer GI1. The gate electrode GE may overlap an area corresponding to the channel.

The gate electrode GE and the lower electrode LE may be made of metal. For example, the gate electrode GE may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof. In addition, the gate electrode GE may be formed as a single film, but is not limited thereto, and may be formed as a multi-film in which two or more materials among metals and alloys are stacked.

A second gate insulating film GI2 may cover the gate electrode GE and the lower electrode LE. The second gate insulating film GI2 may be an inorganic insulating film made of an inorganic material. As the inorganic material, a polysiloxane, a silicon nitride, a silicon oxide, or a silicon oxynitride may be used.

An upper electrode UE of the capacitor Cst may be disposed on the second gate insulating film GI2. The upper electrode UE of the capacitor Cst may be made of metal. For example, the upper electrode UE may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof. In addition, the upper electrode UE may be formed as a single film, but is not limited thereto, and may be formed as a multi-film in which two or more materials among metals and alloys are stacked.

The lower electrode LE and the upper electrode UE may configure the capacitor Cst with the second gate insulating film GI2 interposed therebetween. In FIG. 27, the capacitor Cst is shown to have a two-layered electrode structure of the lower electrode LE and the upper electrode UE, but in another embodiment of the present invention, the capacitor Cst may have a three-layered electrode structure by using the active layer ACT, or may have a three-layer electrode structure or a four or more layered structure by using an electrode of the same layer as a first connection pattern CNP1.

An interlayer insulating film ILD may cover the upper electrode UE. The interlayer insulating film ILD may be an inorganic insulating film made of an inorganic material. As the inorganic material, a polysiloxane, a silicon nitride, a silicon oxide, or a silicon oxynitride may be used.

For better understanding and ease of description in the present embodiment, the first gate insulating film GI1, the second gate insulating film GI2, and the interlayer insulating film ILD may be referred to as a first insulating film group ING1. The first insulating film group ING1 may cover a portion of the transistor. In some embodiments of the present invention, the first insulating film group ING1 may further include the buffer film BF. The first insulating film group ING1 may extend to the non-display area NDA.

The first connection pattern CNP1 may be disposed on the interlayer insulating film ILD. The first connection pattern CNP1 may contact a source electrode and a drain electrode of the active film ACT through contact holes formed in the interlayer insulating film ILD, the second gate insulating film GI2, and the first gate insulating film GI1, respectively.

The first connection pattern CNP1 may be made of metal. For example, the source electrode SE and the drain electrode DE may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof.

In some embodiments, a passivation film may cover the first connection pattern CNP1. The passivation film may be an inorganic insulating film made of an inorganic material. As the inorganic material, a polysiloxane, a silicon nitride, a silicon oxide, or a silicon oxynitride may be used.

A first via film VIA1 may cover the passivation film or the transistor. The first via film VIA1 may be an organic insulating film made of an organic material. As the organic material, an organic insulating material such as a polyacryl-based compound, a polyimide-based compound, a fluorine-based carbon compound such as Teflon, and a benzocyclobutene compound may be used. The organic film may be deposited by a method such as evaporation.

A second connection pattern CNP2 may be connected to the first connection pattern CNP1 through the opening of the first via film VIA1. The second connection pattern CNP2 may be made of at least one of metals such as gold (Au), silver (Ag), aluminum (Al), molybdenum (Mo), chromium (Cr), titanium (Ti), nickel (Ni), neodymium (Nd), and copper (Cu), or an alloy thereof.

A second via film VIA2 may cover the first via film VIA1 and the second connection pattern CNP2. The second via film VIA2 may be an organic insulating film made of an organic material. As the organic material, an organic insulating material such as a polyacryl-based compound, a polyimide-based compound, a fluorine-based carbon compound such as Teflon, and a benzocyclobutene compound may be used.

A first light emitting element electrode LDE1 may be connected to the second connection pattern CNP2 through the opening of the second via film VIA2. The first light emitting element electrode LDE1 may be provided directly on the second via film VIA2. Here, the first light emitting element electrode LDE1 may be an anode of the light emitting element in some embodiments of the present invention.

In some embodiments of the present invention, the configuration of the second via film VIA2 and the second connection pattern CNP2 may be omitted, and the first light emitting element electrode LDE1 may be directly connected to the first contact electrode CNP1 through the opening of the first via film VIA1.

The first light emitting element electrode LDE1 may be made of a metal film such as Ag, Mg, Al, Pt, Pd, Au, Ni, Nd, Ir, Cr, and an alloy thereof and/or an indium tin oxide (ITO), an indium zinc oxide (IZO), a zinc oxide (ZnO), and indium tin zinc oxide (ITZO). The first light emitting element electrode LDE1 may be made of one type of metal, but is not limited thereto, and may be made of two or more types of metals, for example, an alloy of Ag and Mg.

The first light emitting element electrode LDE1 may be formed of a transparent conductive film when an image is to be provided in a lower direction of the substrate SUB, and it may be formed of a metal reflective film and/or a transparent conductive film when an image is to be provided in an upper direction of the substrate SUB.

A pixel defining film PDL partitioning a light emitting area of each pixel PX is provided on the substrate SUB on which the first light emitting element electrode LDE1 is formed. The pixel defining film PDL may be an organic insulating film made of an organic material. As the organic material, an organic insulating material such as a polyacryl-based compound, a polyimide-based compound, a fluorine-based carbon compound such as Teflon, and a benzocyclobutene compound may be used.

The pixel defining film PDL may expose an upper surface of the first light emitting element electrode LDE1, and may protrude from the substrate SUB along a circumference of the pixel PX. A light emitting film EML may be provided in an area of the pixel PX surrounded by the pixel defining film PDL. In other words, the light emitting film EML may be provided in an opening of the pixel defining film PDL.

The light emitting film EML may include a low-molecular or high-molecular material. The low-molecular material may include a copper phthalocyanine (CuPc), (N,N'-Di(naphthalene-1-yl)-N,N'-diphenyl-benzidine: NPB), (tris-8-hydroxyquinoline aluminum)(Alq3), and the like. These materials may be formed by a method of vacuum deposition. The high-molecular material may include PEDOT, a polyphenylenevinylene (PPV)-based material, and a polyfluorene-based material.

The light emitting film EML may be provided as a single layer, or may be provided as a multilayer including various functional layers. When the light emitting film EML is provided as a multilayer, it may have a structure in which a hole injection layer, a hole transport layer, an emission layer, an electron transport layer, and an electron injection layer are stacked in a single or complex structure. Such a light emitting film EML may be formed by a screen printing method, an inkjet printing method, or a laser induced thermal imaging method (LITI).

In some embodiments of the present invention, at least a portion of the light emitting film EML may be integrally formed on a plurality of first light emitting element electrodes LDE1, and it may be individually provided to correspond to each of the plurality of first light emitting element electrodes LDE1.

A second light emitting element electrode LDE2 may be provided on the light emitting film EML. The second light emitting element electrode LDE2 may be provided for each pixel PX, but may be provided to cover most of the display area DA, and may be shared by a plurality of pixels PX. For example, the second light emitting element electrode LDE2 may cover the pixel defining film PDL.

In some embodiments of the present invention, the second light emitting element electrode LDE2 may be used as a cathode or an anode, and when the first light emitting element electrode LDE1 is an anode, the second light emitting element electrode LDE2 may be used as a cathode, and when the first light emitting element electrode LDE1 is a cathode, the second light emitting element electrode LDE2 may be used as an anode.

The second light emitting element electrode LDE1 may be formed of a metal film such as Ag, Mg, Al, Pt, Pd, Au, Ni, Nd, Ir, Cr, and/or a transparent conductive layer such as an indium tin oxide (ITO), an indium zinc oxide (IZO), a zinc oxide (ZnO), and indium tin zinc oxide (ITZO). In the embodiment of the present invention, the second light emitting element electrode LDE2 may be formed of a multi-film of a double film or more including a metal thin film, or for example, a triple-film of ITO/Ag/ITO.

The second light emitting element electrode LDE2 may be formed of a metal reflective film and/or a transparent conductive film when an image is to be provided in a lower direction of the substrate SUB, and it may be formed of a transparent conductive film when an image is to be provided in an upper direction of the substrate SUB.

A set of the first light emitting element electrode LDE1, the light emitting film EML, and the second light emitting element electrode LDE2 described above may be referred to as a light emitting element.

The encapsulation film TFE may be provided on the second light emitting element electrode LDE2. The encapsulation film TFE may be formed as a single layer, but may also be formed as a multilayer. In the present embodiment, the encapsulation film TFE may include first to third encapsulation films ENC1, ENC2, and ENC3. The first to third encapsulation films ENC1, ENC2, and ENC3 may be made of an organic material and/or an inorganic material. The third encapsulation film ENC3 disposed at the outermost portion of the encapsulation film TFE and may be made of an inorganic material. For example, the first encapsulation film ENC1 may be an inorganic film made of an inorganic material, the second encapsulation film ENC2 may be an organic film made of an organic material, and the third encapsulation film ENC3 may be an inorganic film made of an inorganic material. The inorganic material has less penetration of moisture and oxygen than the organic material, but is vulnerable to cracks due to its low elasticity or flexibility. Propagation of cracks may be prevented by forming the first encapsulation film ENC1 and the third encapsulation film ENC3 with an inorganic material and forming the second encapsulation film ENC2 with an organic material. Here, the layer made of an organic material, in other words, the second encapsulation film ENC2 may be completely covered by the third encapsulation film ENC3 so that an end portion thereof is not exposed to the outside. As the organic material, an organic insulating material such as a polyacryl-based compound, a polyimide-based compound, a fluorine-based carbon compound such as Teflon, or a benzocyclobutene compound may be used, and as the inorganic material, a polysiloxane, a silicon nitride, a silicon oxide, or a silicon oxynitride may be used.

The light emitting film EML forming the light emitting element may be easily damaged by moisture or oxygen from the outside. The encapsulation film TFE protects the light emitting film EML by covering it. The encapsulation film TFE covers the display area DA, and may extend to the non-display area NDA outside the display area DA. However, although the insulating films made of an organic material are useful in terms of flexibility and elasticity, they allow moisture and oxygen to permeate more easily than the insulating film made of an inorganic material. In the present embodiment, to prevent penetration of moisture or oxygen through the insulating films made of an organic material, the end portions of the insulating films made of an organic material may be covered by the insulating films made of an inorganic material so as not to be exposed to the outside. For example, the first via film VIA1, the second via film VIA2, and the pixel defining film PDL made of an organic material do not continuously extend to the non-display area NDA, and may be covered by the first encapsulation film ENC1. Accordingly, an upper surface of the pixel defining film PDL, the first via film VIA1, the second via film VIA2, and a side surface of the pixel defining film PDL are encapsulated by the encapsulation film TFE including an inorganic material, so that they may not be exposed to the outside.

However, whether or not the encapsulation film TFE is multi-layered or the material thereof is not limited thereto, and may be variously changed. For example, the encapsulation film TFE may include a plurality of organic material layers and a plurality of inorganic material layers alternately stacked.

A first sensing electrode layer ISM1 may be disposed on the encapsulation film TFE. In some embodiments of the present invention, an additional buffer film may be disposed between the first sensing electrode layer ISM1 and the encapsulation film TFE. The first sensing electrode film ISM1 may be formed of a metal film such as Ag, Mg, Al, Pt, Pd, Au, Ni, Nd, Ir, Cr, and/or a transparent conductive layer such as an indium tin oxide (ITO), an indium zinc oxide (IZO), a zinc oxide (ZnO), and indium tin zinc oxide (ITZO).

A first sensing insulating film ISI1 may be present on the first sensing electrode layer ISM1. The first sensing insulating film INT1 may be an inorganic insulating film made of an inorganic material. As the inorganic material, an inorganic insulating material such as polysiloxane, a silicon nitride, a silicon oxide, or a silicon oxynitride may be used.

A second sensing electrode layer ISM2 may be present on the first sensing insulating film ISI1. The second sensing electrode layer ISM2 may be spaced apart from the first sensing electrode layer ISM1. The second sensing electrode layer ISM2 may be formed of a metal film such as Ag, Mg, Al, Pt, Pd, Au, Ni, Nd, Ir, Cr, and/or a transparent conductive layer such as an indium tin oxide (ITO), an indium zinc oxide (IZO), a zinc oxide (ZnO), and indium tin zinc oxide (ITZO).

Various input detectors may be configured by using the first sensing electrode layer ISM1, the first sensing insulating film ISI1, and the second sensing electrode layer ISM2, which will be described later in FIG. 29 to FIG. 31.

In the embodiment of FIG. 27, the second sensing electrode layer ISM2 may be patterned to configure a first pattern IST1a of the first sensing wire IST1.

A second sensing insulating film ISI2 may be present on the second sensing electrode layer ISM2. The second sensing insulating film ISI2 may be formed of an organic film. For example, as the organic material, an organic insulating material such as a polyacryl-based compound, a polyimide-based compound, a fluorine-based carbon compound such as Teflon, and a benzocyclobutene compound may be used. For example, the second sensing insulating film ISI2 may be made of polymethyl methacrylate, polydimethylsiloxane, polyimide, acrylate, polyethylen terephthalate, or polyethylen naphthalate.

Hereinafter, the non-display area NDA, the first additional area ADA1, and the second additional area ADA2 will be described. In the cross-sectional view of FIG. 27, the non-display area NDA and the first additional area ADA1 will not be separately described. Hereinafter, in the description of the non-display area NDA and the second additional area ADA2, the contents that are described above will be omitted or simply described to avoid duplication of description.

A dam DAM may be disposed at a boundary of the second encapsulation film ENC2. For example, the dam DAM may be disposed between a planarization film FLT and the second encapsulation film ENC2. The dam DAM may have a multi-layered structure, and for example, may include a first dam DAM1 and a second dam DAM2. The second dam DAM2 may be stacked on the first dam DAM1 and the first dam DAM1 may be wider than the second dam DAM2. For example, the first and second dams DAM1 and DAM2 may be made of an organic material. Each of the first and second dams DAM1 and DAM2 may correspond to one of the first via film VIA1, the second via film VIA2, and the pixel defining film PDL. For example, when the first dam DAM1 is made of the same material through the same process as the first via film VIA1, the second dam DAM2 may be made of the same material through the same process as the second via film VIA2 or the pixel defining film PDL. As another example, when the first dam DAM1 is made of the same material through the same process as the second via film VIA2, the second dam DAM2 may be made of the same material through the same process as the pixel defining film PDL. In addition, when a spacer is formed on the pixel defining film PDL of the display area DA, the dam DAM may be formed by using the same material as the spacer.

The dam DAM prevents the organic material of the second encapsulation film ENC2, which has strong fluidity, from overflowing to the outside of the dam DAM during a manufacturing process. The first and third encapsulation films ENC1 and ENC3 made of an inorganic material cover the dam DAM and extend beyond the dam DAM, thereby enhancing adhesion to the substrate SUB or other films on the substrate SUB. For example, the first encapsulation film ENC1 may be in direct contact with the interlayer insulating film ILD beyond the dam DAM.

The first pad PDE1 is disposed on the substrate SUB, but may be spaced apart from the planarization film FLT. The first pad PDE1 may be supported by a second insulating film group ING2. Each of the insulating films of the second insulating film group ING2 may correspond to each of the insulating films of the first insulating film group ING1. The first pad PDE1 may include a first pad electrode PDE1a and a second pad electrode PDE1b. The first pad electrode PDE1a may be made of the same material as the first connection pattern CNP1. The second pad electrode PDE1b may be made of the same material as the second connection pattern CNP2.

The planarization film FLT is disposed on the substrate SUB, but may be spaced apart from an area covered by the encapsulation film TFE. The planarization film FLT may be an organic insulating film made of an organic material. As the organic material, an organic insulating material such as a polyacryl-based compound, a polyimide-based compound, a fluorine-based carbon compound such as Teflon, and a benzocyclobutene compound may be used.

In the present embodiment, the planarization film FLT may be formed after the interlayer insulating film ILD is formed and before the first connection pattern CNP1 is formed. Accordingly, the planarization film FLT and the first via film VIA1 may be formed through different processes. In some embodiments of the present invention, the planarization film FLT and the first via film VIA1 may include different organic materials.

One end of the planarization film FLT may cover the first insulating film group ING1. In addition, a portion of the planarization film FLT corresponding to the second bending area BA2 may fill a first trench TCH1 between the first insulating film group ING1 and the second insulating film group ING2. In the first trench TCH1, the planarization film FLT may directly contact the substrate SUB.

Since the inorganic insulating films have high hardness and low flexibility compared with the organic insulating films, the probability of occurrence of cracks is relatively high. When cracks occur in the inorganic insulating films, the cracks may propagate to wires on the inorganic insulating films, and eventually, defects such as wire breakage may occur.

Accordingly, as shown in FIG. 27, the inorganic insulating films are removed from the second bending area BA2, so that the first trench TCH1 may be formed, and the first insulating film group ING1 and the second insulating film group ING2 may be divided. In the present embodiment, it is shown that all of the inorganic insulating films corresponding to an area of the first trench TCH1 are removed, but in another embodiment of the present invention, some of the inorganic insulating films may remain. For example, some of the inorganic insulating films may contact the substrate SUB. In this case, some remaining inorganic insulating films may include slits, thereby dispersing bending stress.

A second pattern IST1b of the first sensing wire IST1 may be extended on the planarization film FLT, and may be electrically connected to the first pad PDE1. In the present embodiment, the second pattern IST1b may be made of the same material as the first connection pattern CNP1, through the same process.

A first wire protective film LPL1 may cover the planarization film FLT and the second pattern IST1b. In addition, a second wire protective film LPL2 may cover the first wire protective layer LPL1. In some embodiments of the present invention, the configuration of the second wire protective film LPL2 may be omitted. The first and second wire protective films LPL1 and LPL2 may be made of an organic material. Each of the first and second wire protective films LPL1 and LPL2 may correspond to one of the first via film VIA1, the second via film VIA2, and the pixel defining film PDL. For example, when the first wire protective film LPL1 is made of the same material through the same process as the first via film VIA1, the second wire protective layer LPL2 may be made of the same material through the same process as the second via film VIA2 or the pixel defining film PDL. As another example, when the first wire protective film LPL1 is made of the same material through the same process as the second via film VIA2, the second wire protective layer LPL2 may be made of the same material through the same process as the pixel defining film PDL.

The first and second wire protective films LPL1 and LPL2 and the first sensing insulating film ISI1 may include a first opening OPN1 in which the second pattern IST1b overlaps the first pattern IST1a.

The first pattern IST1a may be connected to the second pattern IST1b through the first opening OPN1. According to the present embodiment, a height of the second pattern IST1b disposed on one end of the first insulating film group ING1 and the planarization film FLT may be greater than a height of the second pattern IST1b disposed on the planarization film FLT corresponding to the first trench TCH1.

Accordingly, the first pattern IST1a and the second pattern IST1b may be directly connected without a bridge wire, and since there is no bridge wire, the connection reliability between the first pattern IST1a and the second pattern IST1b is increased. In addition, since a length of the non-display area NDA may be reduced as much as a length of the bridge wire, it is possible to reduce a dead space and to easily realize a thin bezel.

A third pattern IST1c of the first sensing wire IST1 may connect the first pad PDE1 and the second pattern IST1b. The third pattern IST1c may be made of the same material by the same process as the gate electrode GE of the transistor. In some embodiments of the present invention, the third pattern IST1c may be made of the same material by the same process as the upper electrode UE. In some embodiments of the present invention, the odd numbered third pattern IST1c may be formed of the same material by the same process as the gate electrode GE of the transistor, and the even numbered third pattern IST1c may be formed of the same material by the same process as the upper electrode UE. Conversely, the even numbered third pattern IST1c may be formed of the same material by the same process as the gate electrode GE of the transistor, and the odd numbered third pattern IST1c may be formed of the same material by the same process as the upper electrode UE. Accordingly, a short circuit between adjacent wires may be more efficiently prevented.

The second insulating film group ING2 may include a second opening OPN2 exposing the third pattern IST1c. In addition, the planarization film FLT may include an opening corresponding to the second opening OPN2. The second pattern IST1b may be connected to the third pattern IST1c through the second opening OPN2.

Figure 28:
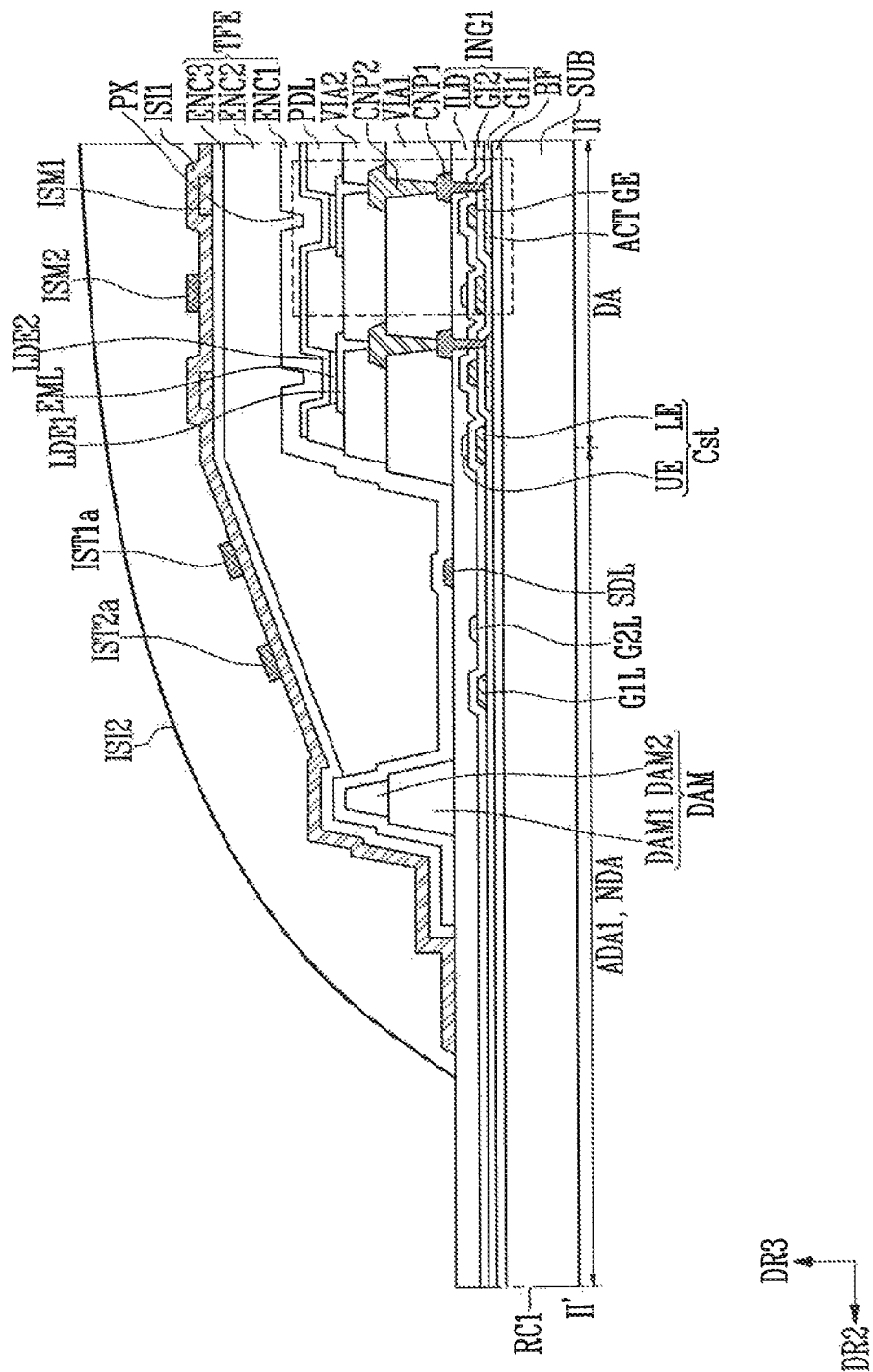

FIG. 28 is a cross-sectional view taken along line II-II' of FIG. 19.

The line II-II' of FIG. 26 may correspond to the first bending axis BX1. However, the same embodiment may be applied to not only the first lateral surface RC1 but also the second lateral surface RC2.

The display wires DST may be configured of a single-layered wire or a multi-layered wire by using at least one of wires G1L, G2L, and SDL, The wire G1L may be made of the same material by the same process as the gate electrode GE. The wire G2L may be made of the same material by the same process as the upper electrode UE. The wire SDL may be made of the same material by the same process as the first connection pattern CNP1.

The first and second patterns IST1a and IST12a of the first and second sensing wires IST1 and IST2 are disposed on the encapsulation film TFE and the first sensing insulating film ISI1 (based on the third direction DR3), and are disposed between the dam DAM and the display area DA (based on the second direction DR2). The first sensing insulating film ISI1 may be disposed between the encapsulation film TFE and the sensing wires IST1 and IST2.

Figure 29:
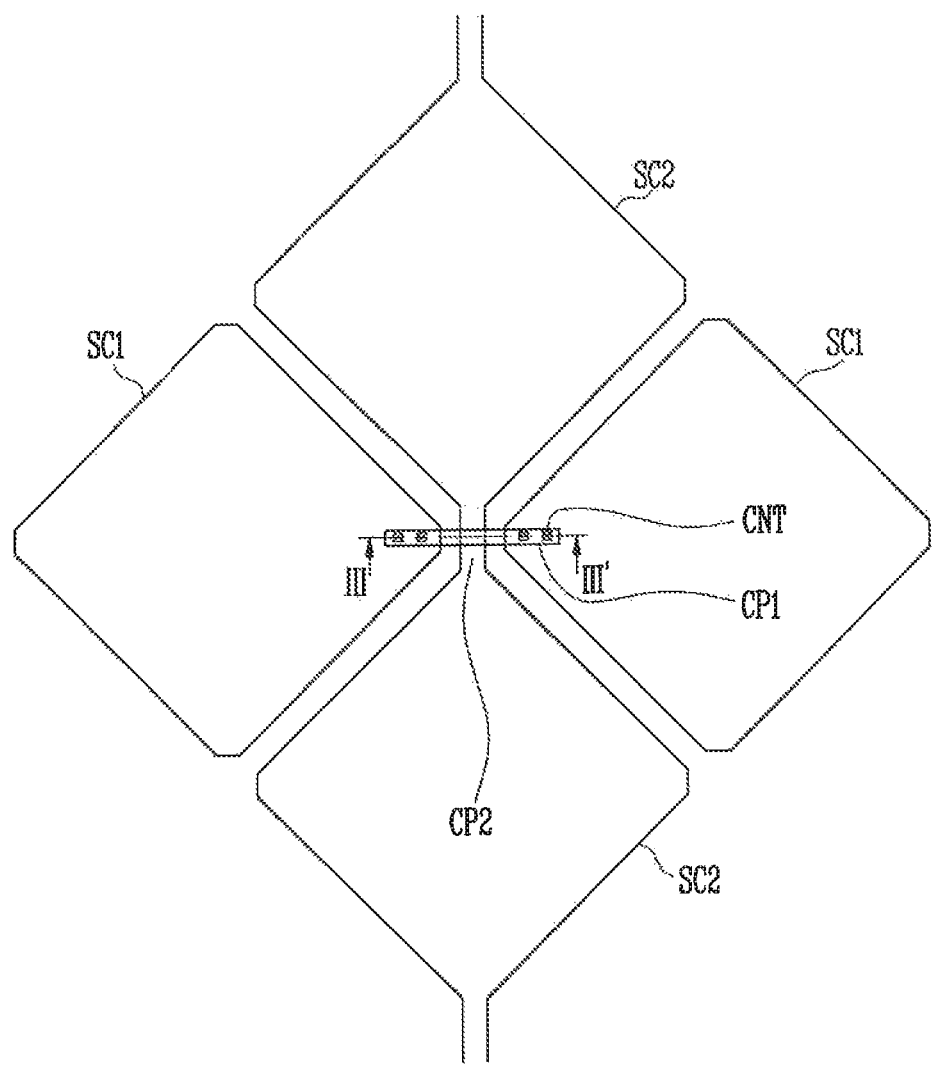
Figure 30:
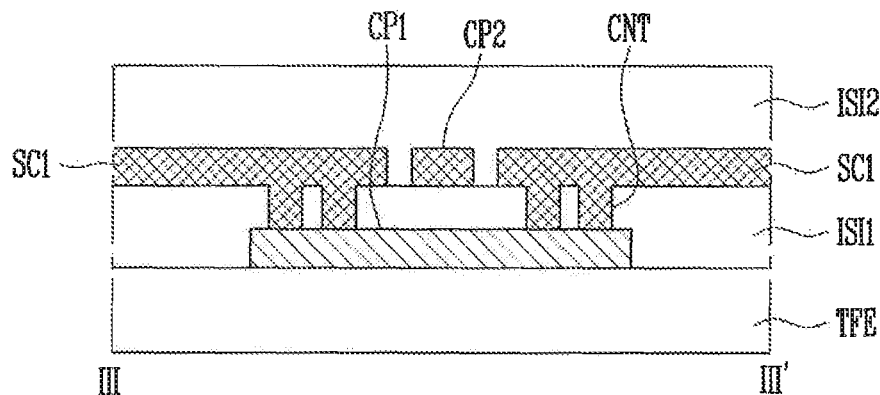

FIG. 29 and FIG. 30 are drawings for explaining sensing electrodes and bridge electrodes according to an embodiment of the present invention. FIG. 30 illustrates a cross-sectional view taken along line III-III' of FIG. 29.

Bridge electrodes CP1 may be disposed on the encapsulation film TFE by patterning the first sensing electrode layer ISM1.

The first sensing insulating layer IST1 covers the bridge electrode CP1, and may include contact holes CNT exposing some of the bridge electrodes CP1.

The first sensing electrodes SC1 and the second sensing electrodes SC2 may be formed on the first sensing insulating film ISI1 by patterning the second sensing electrode layer ISM2. The first sensing electrodes SC1 may be connected to the bridge electrode CP1 through the contact holes CNT.

The second sensing electrodes SC2 may have a connection pattern CP2 in the same layer by patterning the second sensing electrode layer ISM2. In other words, the second sensing electrodes SC2 and the connection pattern CP2 may be integrally formed. Accordingly, a separate bridge electrode may not be necessary to connect the second sensing electrodes SC2.

In some embodiments of the present invention, each of the first and second sensing electrodes SC1 and SC2 may cover a plurality of pixels PX. In this case, when each of the first and second sensing electrodes SC1 and SC2 is formed of an opaque conductive film, a plurality of openings through which the plurality of pixels PX to be covered are exposed may be included. For example, each of the first and second sensing electrodes SC1 and SC2 may be configured in a mesh shape. When each of the first and second sensing electrodes SC1 and SC2 is formed of a transparent conductive film, each of the first and second sensing electrodes SC1 and SC2 may be formed in a form of a plate without an opening.

Figure 31:
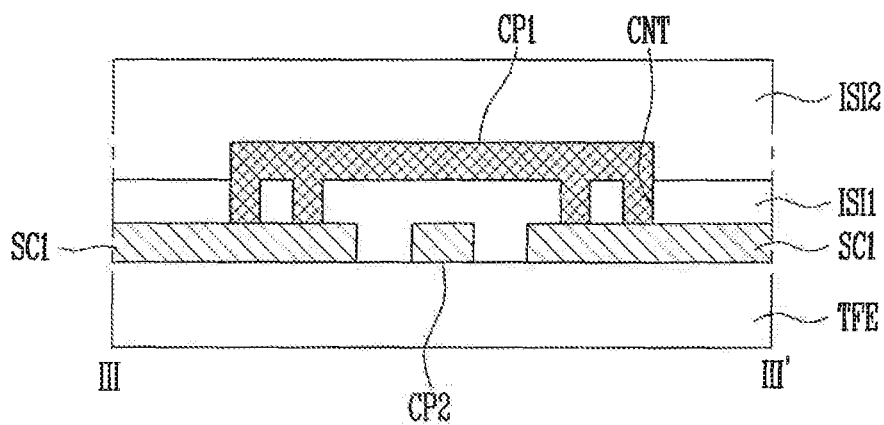

FIG. 31 are drawings for explaining sensing electrodes and bridge electrodes according to another embodiment of the present invention.

FIG. 31 illustrates another cross-sectional view taken along line III-III' of FIG. 29.

The first sensing electrodes SC1 and the second sensing electrodes SC2 may be formed by patterning the first sensing electrode layer ISM1 to be disposed on the encapsulation film TFE.

The first sensing insulating film ISI1 may cover the first sensing electrodes SC1 and the second sensing electrodes SC2, and may include the contact holes CNT exposing some of the first sensing electrodes SC1.

The bridge electrodes CP1 may be formed by patterning the second sensing electrode layer ISM2 to be disposed on the first sensing insulating film ISI1. The bridge electrodes CP1 may be connected to the first sensing electrodes SC1 through the contact holes CNT.

Figure 32:
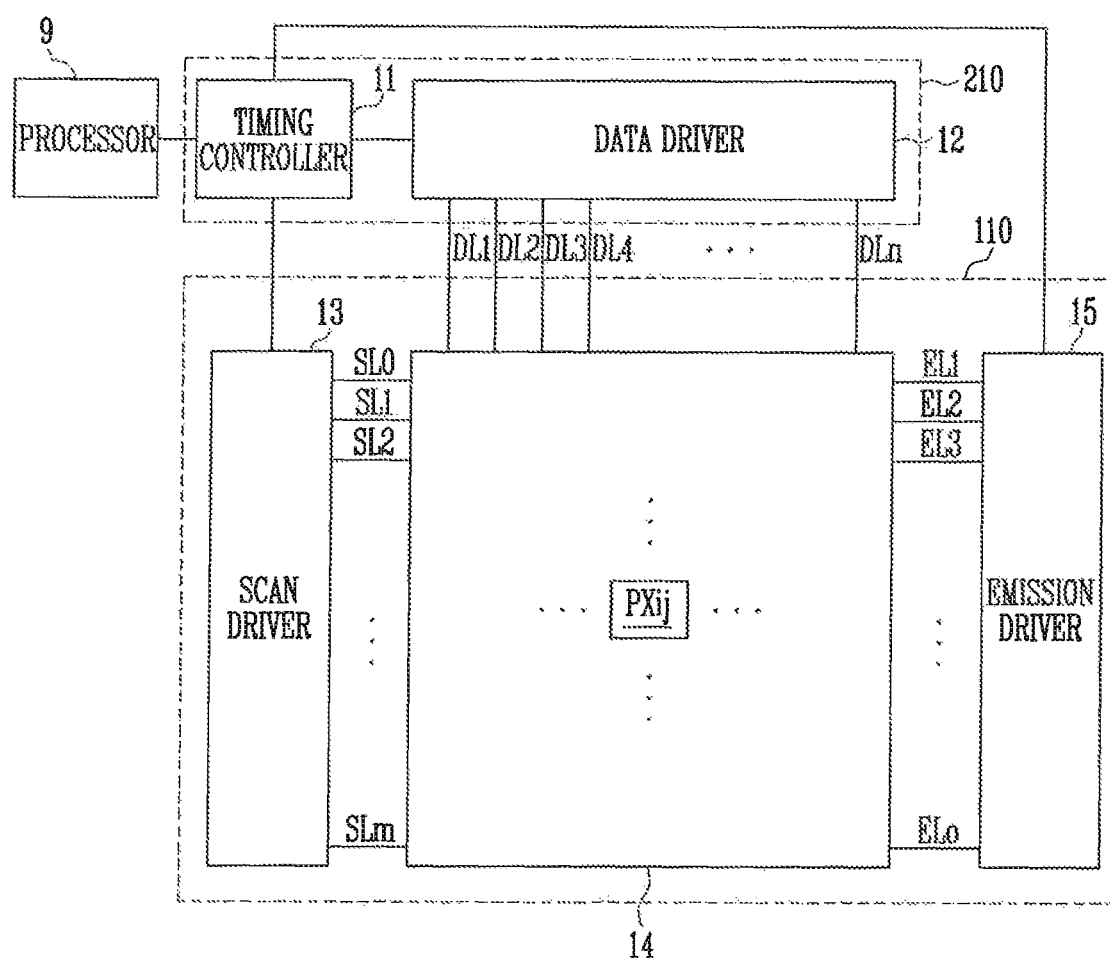
FIG. 32, FIG. 33 and FIG. 34 are drawings for explaining a display device including a pixel according to another embodiment of the present invention.
Figure 33:
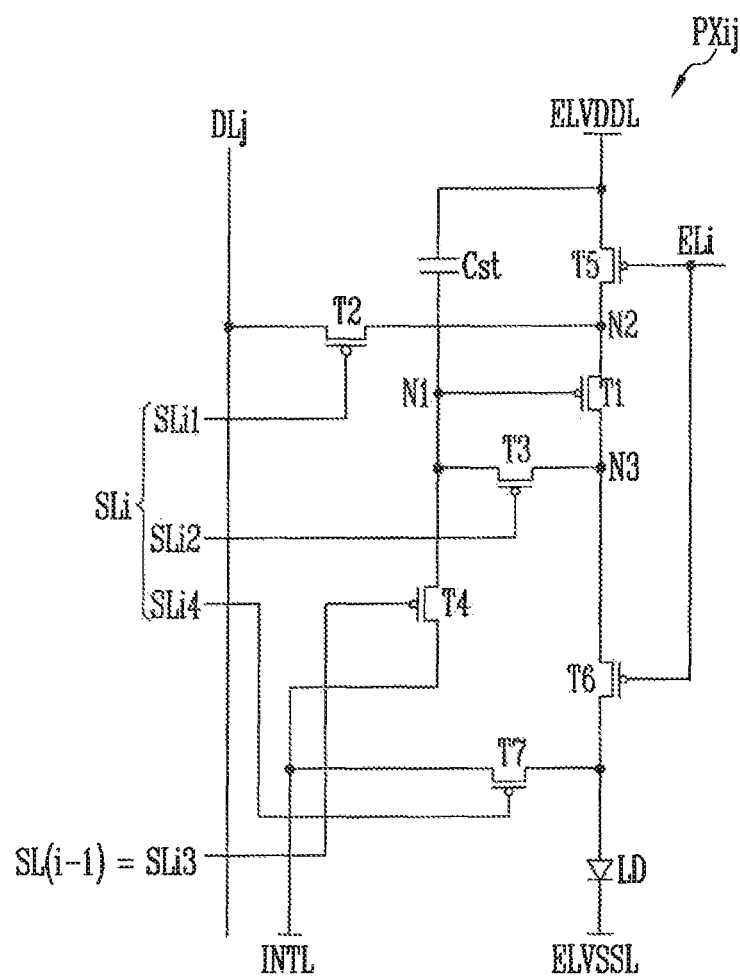
Figure 34:
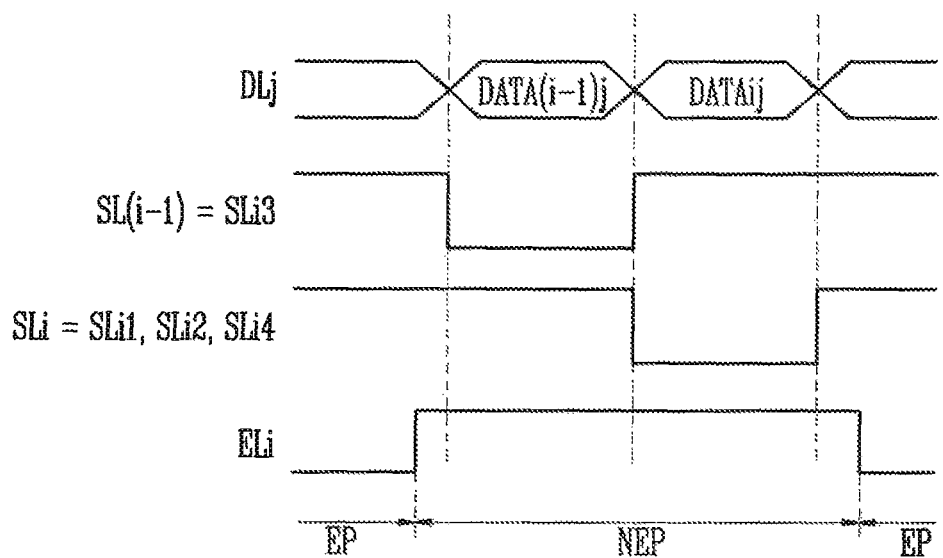

FIG. 32 to FIG. 34 are drawings for explaining a display device including a pixel according to another embodiment of the present invention.

FIG. 32 illustrates a schematic view for explaining a display part and a display driver according to an embodiment of the present invention.

Referring to FIG. 32, the display driver 210 may include the timing controller 11 and the data driver 12, and the display part 110 may include the scan driver 13, the pixel part 14, and an emission driver 15. However, as described above, whether respective functional parts are to be integrated into one IC or into a plurality of ICs, or to be mounted on the display substrate 111 may be variously configured according to specifications of the display device 1.

The timing controller 11 may receive grays and timing signals for each display frame period from the processor 9. Here, the processor 9 may correspond to at least one of a graphics processing unit (GPU), a central processing unit (CPU), and an application processor (AP). The timing signals may include a vertical synchronization signal, a horizontal synchronization signal, a data enable signal, and the like.

Each cycle of the vertical synchronization signal may correspond to each display frame period. Each cycle of the horizontal synchronization signal may correspond to each horizontal period. The grays may be supplied in units of a horizontal line in each horizontal period in response to a pulse of an enable level of the data enable signal. The horizontal line may mean pixels connected to the same scan line and light emitting line (for example, pixel row).

The timing controller 11 may render grays to correspond to the specifications of the display device 1. For example, the processor 9 may provide a red gray, a green gray, and a blue gray for each unit dot. For example, when the pixel part 14 has an RGB stripe structure, a pixel may correspond to each gray one to one. In this case, rendering of grays may not be necessary. However, for example, when the pixel part 14 has a PENTILE™ structure, since adjacent unit dots share a pixel, the pixel may not correspond to each gray one to one. In this case, rendering of grays may be necessary. Rendered or non-rendered grays may be provided to the data driver 12. In addition, the timing controller 11 may provide a data control signal to the data driver 12. In addition, the timing controller 11 may provide a scan control signal to the scan driver 13, and may provide a light emitting control signal to the emission driver 15.

The data driver 12 may generate a data voltage (in other words, data signals) to be provided to data lines (DL1, DL2, DL3, DL4, . . . , DLn) by using the grays and the data control signals received from the timing controller 11. n may be an integer larger than zero.

The scan driver 13 may generate scan signals to be provided to scan lines (SL0, SL1, SL2, . . . , SLm) by using a scan control signal (for example, a clock signal, a scan start signal, etc.) received from the timing controller 11. The scan driver 13 may sequentially supply scan signals having a turn-on level pulse to the scan lines SL0 to SLm. The scan driver 13 may include scan stages configured in a form of a shift register. The scan driver 13 may generate the scan signals through a method of sequentially transmitting a scan start signal, which is a pulse type of a turn-on level, to a next scan stage according to control of the clock signal. m may be an integer larger than zero.

The emission driver 15 may generate light emitting signals to be provided to light emitting lines (EL1, EL2, EL3, . . . , ELo) by using a light emitting control signal (for example, a clock signal, a light emitting stop signal, etc.) received from the timing controller 11. The emission driver 15 may sequentially supply light emitting signals having a turn-off level pulse to the light emitting lines EL1 to ELo. The emission driver 15 may include light emitting stages configured in a form of a shift register. The emission driver 15 may generate light emitting signals by sequentially transmitting a light emitting stop signal having a form of a turn-off level pulse to a next light emitting stage depending on control of a clock signal. o may be an integer larger than zero.

The pixel part 14 includes pixels. Each pixel PXij may be connected to a corresponding data line, scan line, and light emitting line. The pixels may include pixels that emit first color light, pixels that emit second color light, and pixels that emit third color light. The first color, the second color, and the third color may be different colors. For example, the first color may be one color of red, green, and blue, the second color may be one color of red, green, and blue excluding the first color, and the third color may be the remaining color of red, green, blue excluding the first and second colors. In addition, magenta, cyan, and yellow may be used instead of red, green, and blue as the first to third colors.

FIG. 33 is a drawing for explaining a pixel according to an embodiment of the present invention.

Referring to FIG. 33, the pixel PXij includes transistors T1, T2, T3, T4, T5, T6, and T7, a storage capacitor Cst, and a light emitting element LD.

Hereinafter, a circuit configured of a P-type transistor will be described as an example. However, by changing a polarity of a voltage applied to a gate terminal, a circuit configured of an N-type transistor may be designed. A circuit configured of a combination of a P-type transistor and an N-type transistor may also be designed. The P-type transistor refers to a transistor in which an amount of current increases when a voltage difference between a gate electrode and a source electrode increases in a negative direction. The N-type transistor refers to a transistor in which an amount of current increases when a voltage difference between a gate electrode and a source electrode increases in a positive direction. The transistor may have various types such as a thin film transistor (TFT), a field effect transistor (FET), and a bipolar junction transistor (BJT).

In the first transistor T1, a gate electrode may be connected to a first node N1, a first electrode may be connected to a second node N2, and a second electrode may be connected to a third node N3. The first transistor T1 may be referred to as a driving transistor.

In the second transistor T2, a gate electrode may be connected to a scan line SLi1, a first electrode may be connected to a data line DLj, and a second electrode may be connected to the second node N2. The second transistor T2 may be referred to as a scan transistor.

In the third transistor T3, a gate electrode may be connected to a scan line SLi2, a first electrode may be connected to the first node N1, and a second electrode may be connected to the third node N3. The third transistor T3 may be referred to as a diode-connection transistor.

In the fourth transistor T4, a gate electrode may be connected to a scan line SLi3, a first electrode may be connected to the first node N1, and a second electrode may be connected to an initialization line INTL. The fourth transistor T4 may be referred to as a gate initialization transistor.

In the fifth transistor T5, a gate electrode may be connected to an i-th light emitting line ELi, a first electrode may be connected to a first power line ELVDDL, and a second electrode may be connected to the second node N2. The fifth transistor T5 may be referred to as a light emitting transistor. In another embodiment of the present invention, the gate electrode of the fifth transistor T5 may be connected to a light emitting line different from a light emitting line connected to a gate electrode of the sixth transistor T6.

In the sixth transistor T6, the gate electrode may be connected to the i-th light emitting line ELi, a first electrode may be connected to the third node N3, and a second electrode may be connected to an anode of the light emitting element LD. The sixth transistor T6 may be referred to as a light emitting transistor. In another embodiment of the present invention, the gate electrode of the sixth transistor T6 may be connected to a light emitting line different from a light emitting line connected to the gate electrode of the fifth transistor T5. In this case, the gates of the fifth and sixth transistors T5 and T6 may not be connected to each other.

In the seventh transistor T7, a gate electrode may be connected to a scan line SLi4, a first electrode may be connected to the initialization line INTL, and a second electrode may be connected to the anode of the light emitting element LD. The seventh transistor T7 may be referred to as a light emitting element initialization transistor.

A first electrode of the storage capacitor Cst may be connected to the first power line ELVDDL, and a second electrode thereof may be connected to the first node N1. In other words, the second electrode of the storage capacitor Cst may be connected to the gate electrode of the first transistor T1.

The anode of the light emitting element LD may be connected to the second electrode of the sixth transistor T6, and a cathode of the light emitting element LD may be connected to a second power line ELVSSL. The light emitting element LD may be a light emitting diode. The light emitting element LD may include an organic light emitting diode, an inorganic light emitting diode, and a quantum dot/well light emitting diode. The light emitting element LD may emit light in one of a first color, a second color, and a third color. In addition, in the present embodiment, only one light emitting element LD is provided in each pixel, but in another embodiment of the present invention, a plurality of light emitting elements may be provided in each pixel. In this case, the plurality of light emitting elements may be connected in series, in parallel, or in series/parallel.

A first power source voltage may be applied to the first power line ELVDDL, a second power source voltage may be applied to the second power line ELVSSL, and an initialization voltage may be applied to the initialization line INTL. For example, the first power source voltage may be larger than the second power source voltage. For example, the initialization voltage may be equal to or larger than the second power source voltage. For example, the initialization voltage may correspond to a smallest one of data voltages that may be provided. In another example, the initialization voltage may be smaller than the data voltages that may be provided.

FIG. 34 is a drawing for explaining an example driving method of the pixel of FIG. 33.

Hereinafter, for better understanding and ease of description, it is assumed that the scan lines SLi1, SLi2, and SLi4 are i-th scan lines SLi, and the scan line SLi3 is an (i−1)-th scan line SL(i−1). However, the scan lines SLi1, SLi2, SLi3, and SLi4 may have various connection relationships according to embodiments of the present invention. For example, the scan line SLi4 may be the (i−1)-th scan line or the (i+1)-th scan line.

First, a light emitting signal having a turn-off level (e.g., a logic high level) is applied to the i-th light emitting line ELi, a data voltage DATA(i−1)j for an (i−1)-th pixel is applied to the data line DLj, and a scan signal having a turn-on level (e.g., a logic low level) is applied to the scan line SLi3. The logic high or low level may vary depending on whether the transistor is a P-type or N-type transistor.

In this case, since the scan signal having a turn-off level is applied to the scan lines SLi1 and SLi2, the second transistor T2 is in a turn-off state, and it prevents the data voltage DATA(i−1)j for the (i−1)-th pixel from being inputted to the pixel PXij.

In this case, since the fourth transistor T4 is in a turned-on state, the first node N1 is connected to the initialization line INTL, so that a voltage of the first node N1 is initialized. Since the light emitting signal having a turn-off level is applied to the light emitting line ELi, the fifth and sixth transistors T5 and T6 are in a turn-off state, and unnecessary light emitting of the light emitting element LD according to the initialization voltage application process is prevented.

Next, the data voltage DATAij for the i-th pixel PXij is applied to the data line DLj, and the scan signal having a turn-on level is applied to the scan lines SLi1 and SLi2. Accordingly, the second, first and third transistors T2, T1, and T3 are turned on, and thus the data line DLj and the first node N1 are electrically connected. Accordingly, a compensation voltage obtained by subtracting a threshold voltage of the first transistor T1 from the data voltage DATAij is applied to the second electrode (in other words, the first node N1) of the storage capacitor Cst, and the storage capacitor Cst maintains a voltage corresponding to a difference between the first power source voltage and the compensation voltage. This period may be referred to as a threshold voltage compensation period or data writing period.

In addition, when the scan line SLi4 is the i-th scan line, the seventh transistor T7 is turned on, so the anode of the light emitting element LD and the initialization line INTL are connected, and the light emitting element LD is initialized with an amount of charge corresponding to a voltage difference between the initialization voltage and the second power source voltage.

Thereafter, as the light emitting signal having a turn-on level is applied to the i-th light emitting line ELi, the fifth and sixth transistors T5 and T6 may be turned on. Accordingly, a driving current path connecting the first power line ELVDDL, the fifth transistor T5, the first transistor T1, the sixth transistor T6, the light emitting element LD, and the second power line ELVSSL is formed.

An amount of driving current flowing through the first and second electrodes of the first transistor T1 is adjusted according to a voltage maintained in the storage capacitor Cst. The light emitting element LD emits light with a luminance corresponding to the amount of driving current. The light emitting element LD emits light until a light emitting signal of a turn-off level is applied to the light emitting line ELL When the light emitting signal has a turned-on level, pixels receiving the corresponding light emitting signal may be in a display state. Accordingly, a period in which the light emitting signal has the turned-on level may be referred to as a light emitting period EP (or a light emitting permissive period). In addition, when the light emitting signal has a turned-off level, pixels receiving the corresponding light emitting signal may be in a non-display state. Accordingly, a period in which the light emitting signal has the turned-off level may be referred to as a non-light emitting period NEP (or a light emitting non-permissive period).

The non-light emitting period NEP described in FIG. 34 is to prevent the pixel PXij from emitting light with undesired luminance during the initialization period and the data writing period.

While data written in the pixel PXij is maintained (for example, one frame period), one or more non-light emitting periods NEP may be additionally provided. This may be used to effectively express a low gray level by reducing the light emitting period EP of the pixel PXij, or to smoothly blur the motion of an image.

While this invention has been described in connection with embodiments thereof, it is to be understood that the invention is not limited to the disclosed embodiments, but, is intended to cover various modifications and equivalent arrangements included within the spirit and scope of the appended claims. Therefore, those skilled in the art will understand that various modifications and other equivalent embodiments of the present invention are possible.

What is claimed is:

1. A display device, comprising:
a pixel part including pixels;
a sensor part overlapping the pixel part and including sensors; and
a sensor driver that transmits a sensing signal in units of p sensors in each sensing time to a first area of the sensor part in a first mode comprising a plurality of sensing times, transmits the sensing signal in units of q sensors in each sensing time to the first area in a second mode comprising a plurality of sensing times, and transmits the sensing signal in units of r sensors in each sensing time to the first area in a third mode comprising a plurality of sensing times,
wherein p is an integer greater than 0,
q and r are integers greater than p, and
the sensor driver sets a sensing frequency, the first area, the number of sensing times per sensing frame period, whether or not the sensor driver is synchronized with a timing signal of the pixel part, or a voltage level of the sensing signal, to be different in the second mode and the third mode.

2. The display device of claim 1, wherein
the sensor driver sets the voltage of the sensing signal of the third mode to be smaller than the voltage of the sensing signal of the second mode.

3. The display device of claim 2, wherein
the sensor driver sets the voltage of the sensing signal of the first mode to be the same as the voltage of the sensing signal of the second mode.

4. The display device of claim 1, wherein
the pixel part is in a display state in the first mode and the second mode, and is in a non-display state in the third mode.

5. The display device of claim 1, wherein
the sensor driver sets the sensing frequency of the third mode to be lower than the sensing frequency of the second mode.

6. The display device of claim 5, wherein
the sensor driver sets the sensing frequency of the first mode to be higher than the sensing frequency of the second mode.

7. The display device of claim 1, wherein
the sensor driver sets the first area of the third mode to be smaller than the first area of the second mode.

8. The display device of claim 7, wherein
the sensor driver supplies the sensing signal only to the sensors of the first area in the third mode, and
the sensor driver supplies the sensing signal to the sensors outside of the first area in the second mode.

9. The display device of claim 7, wherein
the sensor driver sets the first area of the third mode to partially overlap the first area of the second mode or to not overlap the first area.

10. The display device of claim 1, wherein
the sensor driver sets the number of sensing times per sensing frame period of the third mode to be larger than the number of sensing times per sensing frame period of the second mode.

11. The display device of claim 10,
wherein the sensor driver sets the number of sensing times per sensing frame period of the first mode to be smaller than the number of sensing times per sensing frame period of the second mode.

12. The display device of claim 1, wherein
the timing signal includes a horizontal synchronization signal, and
the sensor driver is asynchronous with the horizontal synchronization signal in the third mode when supplying the sensing signal.

13. The display device of claim 12, wherein
the sensor driver is synchronized with the horizontal synchronization signal in the second mode when supplying the sensing signal.

14. A driving method of a display device, comprising:

transmitting, by a sensor driver, a sensing signal in units of p sensors in each sensing time to a first area of a sensor part in a first mode comprising a plurality of sensing times;

transmitting, by the sensor driver, the sensing signal in units of q sensors in each sensing time to the first area in a second mode comprising a plurality of sensing times; and transmitting, by the sensor driver, the sensing signal in units of r sensors in each sensing time to the first area in a third mode comprising a plurality of sensing times, wherein p is an integer greater than 0, q and r are integers greater than p, and a sensing frequency, the first area, the number of sensing times per sensing frame period, whether or not the sensor driver is synchronized with a timing signal of a pixel part, or a voltage of the sensing signal, is different in the second mode and the third mode.

15. The driving method of the display device of claim 14, wherein the first area of the third mode is set to be smaller than the first area of the second mode.

16. The driving method of the display device of claim 14, wherein the number of sensing times per sensing frame period of the third mode is set to be larger than the number of sensing times per sensing frame period of the second mode.

17. The driving method of the display device of claim 14, wherein the voltage of the sensing signal of the third mode is set to be smaller than the voltage of the sensing signal of the second mode.

18. The driving method of the display device of claim 14, wherein the pixel part is in a display state in the first mode and the second mode, and is in a non-display state in the third mode.

19. The driving method of the display device of claim 14, wherein the sensing frequency of the third mode is set to be lower than the sensing frequency of the second mode.

20. The driving method of the display device of claim 19, wherein the sensing frequency of the first mode is set to be higher than the sensing frequency of the second mode.

* * * * *